(12) United States Patent
Kim et al.

(10) Patent No.: US 12,334,903 B2
(45) Date of Patent: Jun. 17, 2025

(54) SUBSTRATE COMPRISING ACOUSTIC RESONATORS CONFIGURED AS AT LEAST ONE ACOUSTIC FILTER

(71) Applicant: QUALCOMM Incorporated, San Diego, CA (US)

(72) Inventors: Jonghae Kim, San Diego, CA (US); Je-Hsiung Lan, San Diego, CA (US); Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 321 days.

(21) Appl. No.: 17/008,320

(22) Filed: Aug. 31, 2020

(65) Prior Publication Data

US 2022/0069797 A1    Mar. 3, 2022

(51) Int. Cl.
*H03H 9/05* (2006.01)
*H03H 3/02* (2006.01)
(Continued)

(52) U.S. Cl.
CPC .............. *H03H 9/058* (2013.01); *H03H 3/02* (2013.01); *H03H 3/08* (2013.01); *H03H 9/0504* (2013.01);
(Continued)

(58) Field of Classification Search
CPC   H03H 9/02; H03H 9/205; H03H 9/54; H03H 9/70
See application file for complete search history.

(56) References Cited

U.S. PATENT DOCUMENTS

| | | | | |
|---|---|---|---|---|
| 7,378,922 B2 * | 5/2008 | Kubo | ................... | H03H 9/1092 333/133 |
| 7,615,833 B2 * | 11/2009 | Larson, III | ............... | H03H 3/02 257/416 |

(Continued)

FOREIGN PATENT DOCUMENTS

| TW | 200416785 A | 9/2004 |
|---|---|---|
| TW | 200935961 A | 8/2009 |

OTHER PUBLICATIONS

Terzieva, "Overview of bulk acoustic wave technology and its applications" published in Electrotechnica & Electronica, E+E on May 27, 2016. (Year: 2016).*

(Continued)

*Primary Examiner* — Andrea Lindgren Baltzell
*Assistant Examiner* — Alan Wong
(74) *Attorney, Agent, or Firm* — Loza & Loza

(57) ABSTRACT

A substrate that includes an encapsulation layer, a first acoustic resonator, a second acoustic resonator, at least one first dielectric layer, a plurality of first interconnects, at least one second dielectric layer, and a plurality of second interconnects. The first acoustic resonator is located in the encapsulation layer. The first acoustic resonator includes a first piezoelectric substrate comprising a first thickness. The second acoustic is located in the encapsulation layer. The second acoustic resonator includes a second piezoelectric substrate comprising a second thickness that is different than the first thickness. The at least one first dielectric layer is coupled to a first surface of the encapsulation layer. The plurality of first interconnects is coupled to the first surface of the encapsulation layer. The plurality of first interconnects is located at least in the at least one first dielectric layer.

19 Claims, 20 Drawing Sheets

*SIDE PROFILE VIEW*

(51) Int. Cl.
  *H03H 3/08*     (2006.01)
  *H03H 9/10*     (2006.01)
  *H03H 9/205*    (2006.01)
  *H03H 9/25*     (2006.01)
  *H03H 9/56*     (2006.01)
  *H03H 9/64*     (2006.01)
  *H03H 9/70*     (2006.01)
  *H03H 9/72*     (2006.01)

(52) U.S. Cl.
  CPC ........ *H03H 9/0571* (2013.01); *H03H 9/0576* (2013.01); *H03H 9/1007* (2013.01); *H03H 9/1064* (2013.01); *H03H 9/205* (2013.01); *H03H 9/25* (2013.01); *H03H 9/568* (2013.01); *H03H 9/6483* (2013.01); *H03H 9/706* (2013.01); *H03H 9/725* (2013.01)

(56) References Cited

U.S. PATENT DOCUMENTS

| | | | | |
|---|---|---|---|---|
| 7,642,882 B2 * | 1/2010 | Nam | .................. | H03H 9/46 333/133 |
| 7,683,736 B2 * | 3/2010 | Inoue | .................. | H03H 9/72 333/132 |
| 8,461,940 B2 * | 6/2013 | Takada | .................. | H03H 3/00 333/186 |
| 9,431,996 B2 * | 8/2016 | Watanabe | .............. | H10N 30/01 |
| 9,478,213 B2 * | 10/2016 | Tajima | ................... | G10K 11/18 |
| 9,634,641 B2 * | 4/2017 | Nishimura | ........... | H03H 9/0576 |
| 9,831,851 B2 * | 11/2017 | Moulard | ................ | H03H 9/706 |
| 10,097,152 B2 * | 10/2018 | Moulard | ................ | H01L 41/187 |
| 11,165,406 B2 * | 11/2021 | Lin | .................... | H03H 9/02007 |
| 11,502,067 B2 * | 11/2022 | Chen | ........................ | H01L 24/19 |
| 2006/0012021 A1 | 1/2006 | Larson, III et al. | | |
| 2007/0115079 A1 | 5/2007 | Kubo et al. | | |
| 2015/0123744 A1 | 5/2015 | Nishimura et al. | | |
| 2015/0333248 A1 | 11/2015 | Moulard | | |
| 2018/0062618 A1 | 3/2018 | Nagarkar et al. | | |

OTHER PUBLICATIONS

International Search Report and Written Opinion—PCT/US2021/048024—ISA/EPO—Dec. 22, 2021.
Taiwan Search Report—TW110132127—TIPO—Jan. 10, 2025.

* cited by examiner

SIDE PROFILE VIEW

SIDE PROFILE VIEW

SIDE PROFILE VIEW

SIDE PROFILE VIEW

SIDE PROFILE VIEW

SIDE PROFILE VIEW

*SIDE PROFILE VIEW*

SUBSTRATE COMPRISING ACOUSTIC RESONATORS CONFIGURED AS AT LEAST ONE ACOUSTIC FILTER

FIELD

Various features relate to packages and substrates, but more specifically to substrates that include acoustic resonators embedded in an encapsulation layer.

BACKGROUND

FIG. 1 illustrates a package 100 that includes a substrate 102, an integrated device 106, an integrated device 108, and an integrated device 109. The integrated device 106, the integrated device 108 and the integrated device 109 are coupled to a surface of the substrate 102. The substrate 102 includes at least one dielectric layer 120 and a plurality of interconnects 122. A plurality of solder interconnects 130 is coupled to the substrate 102. The integrated devices 106, 108 and 109 can take up a lot of space and real estate. A small wireless device has space constraints and may not be able to accommodate many integrated devices. Wireless devices may depend on many integrated devices in order to provide efficient and effective wireless communication. The relatively big size of the integrated devices may limit the wireless performance of a small wireless device, since not as many integrated devices are going to be able to fit inside a small wireless device. There is an ongoing need to provide integrated devices with better form factors and smaller sizes so that the integrated devices may be implemented in smaller devices.

SUMMARY

Various features relate to packages and substrates, but more specifically to substrates that include acoustic resonators embedded in an encapsulation layer.

One example provides a substrate that includes an encapsulation layer, a first acoustic resonator, a second acoustic resonator, at least one first dielectric layer, a plurality of first interconnects, at least one second dielectric layer, and a plurality of second interconnects. The first acoustic resonator is located in the encapsulation layer. The first acoustic resonator includes a first piezoelectric substrate comprising a first thickness. The second acoustic resonator is located in the encapsulation layer. The second acoustic resonator includes a second piezoelectric substrate comprising a second thickness that is different than the first thickness. The at least one first dielectric layer is coupled to a first surface of the encapsulation layer. The plurality of first interconnects is coupled to the first surface of the encapsulation layer. The plurality of first interconnects is located at least in the at least one first dielectric layer. The at least one second dielectric layer is coupled to a second surface of the encapsulation layer. The plurality of second interconnects is coupled to the second surface of the encapsulation layer. The plurality of second interconnects is located at least in the at least one second dielectric layer.

Another example provides an apparatus that includes an integrated device and a substrate coupled to the integrated device. The substrate includes means for encapsulation, means for first acoustic resonance located in the means for encapsulation, means for second acoustic resonance located in the means for encapsulation, at least one first dielectric layer coupled to a first surface of the means for encapsulation, a plurality of first interconnects coupled to the first surface of the means for encapsulation, where the plurality of first interconnects is located at least in the at least one first dielectric layer, at least one second dielectric layer coupled to a second surface of the means for encapsulation, and a plurality of second interconnects coupled to the second surface of the means for encapsulation, where the plurality of second interconnects is located at least in the at least one second dielectric layer.

Another example provides a method for fabricating a substrate. The method provides a first acoustic resonator comprising a first piezoelectric substrate that includes a first thickness. The method provides a second acoustic resonator comprising a second piezoelectric substrate that includes a second thickness that is different than the first thickness. The method forms an encapsulation layer over the first acoustic resonator and the second acoustic resonator. The method forms a plurality of first interconnects over a first surface of the encapsulation layer. The method forms at least one first dielectric layer over the first surface of the encapsulation layer. The method forms a plurality of second interconnects over a second surface of the encapsulation layer. The method forms at least one second dielectric layer over the second surface of the encapsulation layer.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate and an integrated device coupled to the substrate. The substrate includes an encapsulation layer, a first acoustic resonator, a second acoustic resonator, at least one first dielectric layer, a plurality of first interconnects, at least one second dielectric layer, and a plurality of second interconnects. The first acoustic resonator is located in the encapsulation layer. The first acoustic resonator includes a first piezoelectric substrate comprising a first thickness. The second acoustic resonator is located in the encapsulation layer. The second acoustic resonator includes a second piezoelectric substrate comprising a second thickness that is different than the first thickness. The at least one first dielectric layer is coupled to a first surface of the encapsulation layer. The plurality of first interconnects is coupled to the first surface of the encapsulation layer. The plurality of first interconnects is located at least in the at least one first dielectric layer. The at least one second dielectric layer is coupled to a second surface of the encapsulation layer. The plurality of second interconnects is coupled to the second surface of the encapsulation layer. The plurality of second interconnects is located at least in the at least one second dielectric layer. The design and configuration of the substrate that includes acoustic resonators configured as at least one acoustic filter, provides an overall better form factor and smaller size (while still providing effective performance capabilities) so that the package, the substrate and the acoustic resonators may be implemented in smaller devices.

Figure 1:
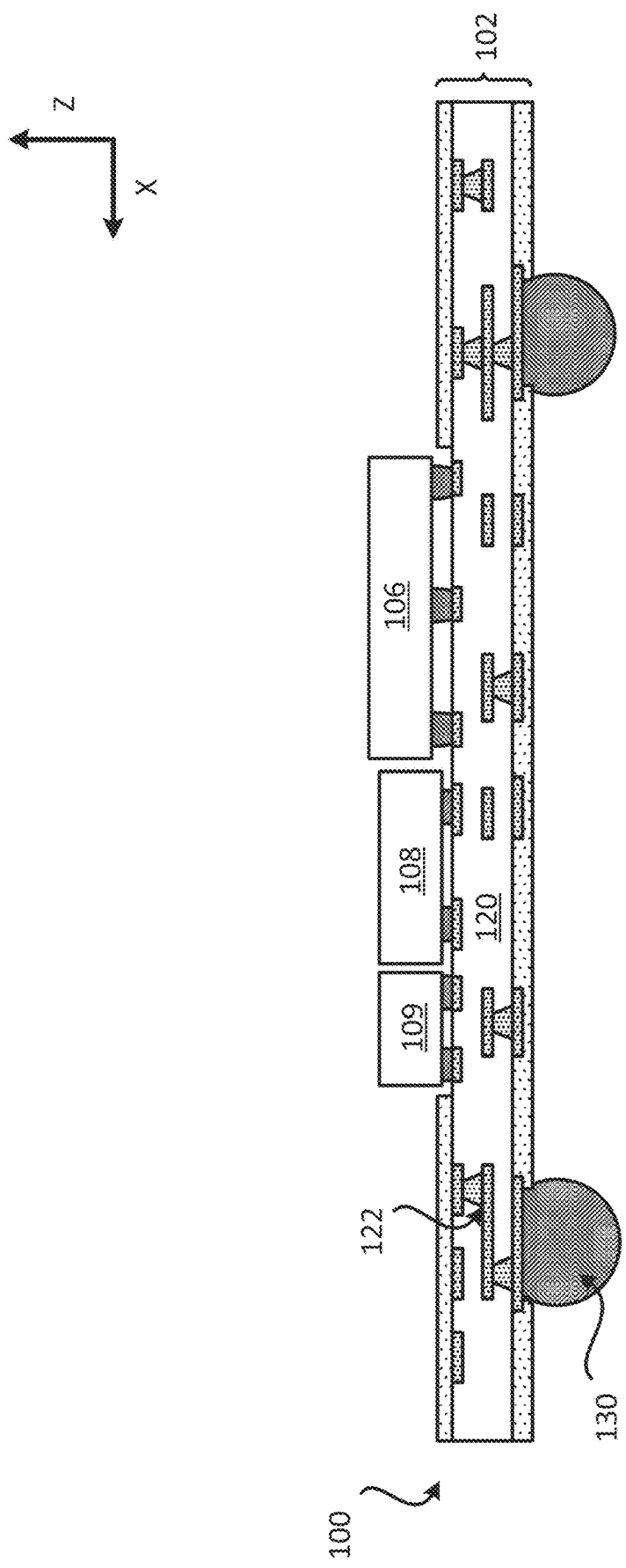
FIG. 1 illustrates a package that includes various integrated devices coupled to a substrate.
Figure 2:
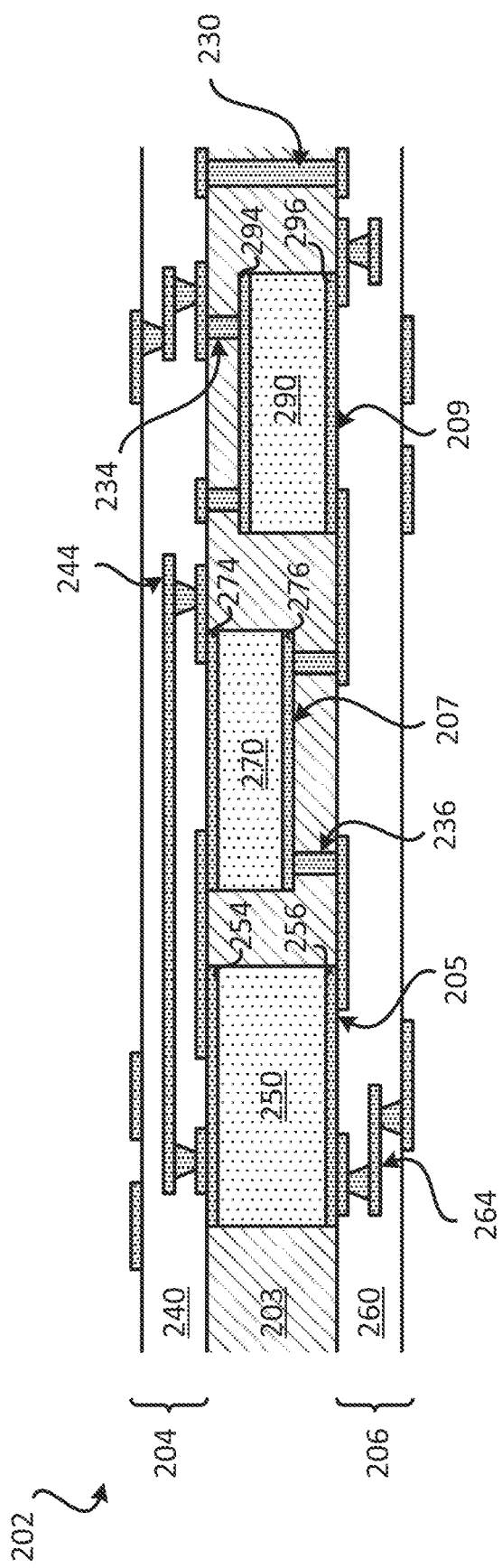
FIG. 2 illustrates a profile view of an exemplary substrate that includes acoustic resonators.

Exemplary Packages and Substrates Comprising Acoustic Resonators Embedded in an Encapsulation Layer FIG. 2 illustrates an example of a substrate 202 that includes acoustic resonators embedded in an encapsulation layer. The substrate 202 includes an encapsulation layer 203, a first metallization portion 204, a second metallization portion 206, at least one acoustic resonator 205, at least one acoustic resonator 207, at least one acoustic resonator 209, at least one first dielectric layer 240, at least one second dielectric layer 260, a plurality of first interconnects 244, a plurality of second interconnects 264, at least one interconnect 230, at least one interconnect 234, and at least one interconnect 236.

The at least one acoustic resonator 205, the at least one acoustic resonator 207, and the at least one acoustic resonator 209 are located in the encapsulation layer 203. The at least one interconnect 230, the at least one interconnect 234, and the at least one interconnect 236 are located in the encapsulation layer 203. The at least one interconnect 230, the at least one interconnect 234, and the at least one interconnect 236 may be via interconnects that extend through partially and/or completely through the encapsulation layer 203. The encapsulation layer 203 may include a mold, a resin and/or an epoxy. The encapsulation layer 203 may be a means for encapsulation.

The acoustic resonator 205 includes a substrate 250, a first metal layer 254 and a second metal layer 256. The first metal layer 254 is formed over and coupled to a first surface of the substrate 250. The second metal layer 256 is formed over and coupled to a second surface of the substrate 250. The substrate 250 may be a piezoelectric substrate. The substrate 250 may include a piezoelectric material (e.g., Aluminum Nitride (AlN), Lithium Niobate, Lithium Tantalate). The first metal layer 254 and/or the second metal layer 256 may be configured as interconnects, electrodes and/or transducers.

The acoustic resonator 207 includes a substrate 270, a first metal layer 274 and a second metal layer 276. The first metal layer 274 is formed over and coupled to a first surface of the substrate 270. The second metal layer 276 is formed over and coupled to a second surface of the substrate 270. The substrate 270 may be a piezoelectric substrate. The substrate 270 may include a piezoelectric material (e.g., Aluminum Nitride (AlN), Lithium Niobate, Lithium Tantalate). The first metal layer 274 and/or the second metal layer 276 may be configured as interconnects, electrodes and/or transducers.

The acoustic resonator 209 includes a substrate 290, a first metal layer 294 and a second metal layer 296. The first metal layer 294 is formed over and coupled to a first surface of the substrate 290. The second metal layer 296 is formed over and coupled to a second surface of the substrate 290. The substrate 290 may be a piezoelectric substrate. The substrate 250 may include a piezoelectric material (e.g., Aluminum Nitride (AlN), Lithium Niobate, Lithium Tantalate). The first metal layer 294 and/or the second metal layer 296 may be configured as interconnects, electrodes and/or transducers.

An acoustic resonator may be a means for acoustic resonance (e.g., means for first acoustic resonance, means for second acoustic resonance, means for third acoustic resonance, means for fourth acoustic resonance, etc.). A piezoelectric substrate as used in the disclosure may mean a substrate that includes a piezoelectric material and/or a substrate that includes a piezoelectric layer coupled to and located over a surface of the substrate. Different implementations may use different materials for the piezoelectric material and/or the piezoelectric layer.

The acoustic resonators 205, 207, and/or 209 may be configured to have different designs and configurations. Various combinations of the acoustic resonators 205, 207, and/or 209 may be configured as at least one acoustic filter in a substrate. As will be further described below, the different designs and configurations may allow the substrate that includes the acoustic resonators to have different filtering capabilities. The acoustic resonators 205, 207, and/or 209 (or any acoustic resonator) may be one of an acoustic wave (SAW) device, a bulk acoustic wave (BAW) device, a thin-film bulk acoustic wave resonator (FBAR) and/or a contour mode resonator (CMR).

As shown in FIG. 2, the acoustic resonators 205, 207 and 209 have substrates with different thicknesses. For example, the thickness of the substrate 250 of the acoustic resonator 205 is greater than (i) the thickness of the substrate 270 of the acoustic resonator 207 and (ii) the thickness of the substrate 290 of the acoustic resonator 209. The thickness of the substrate 290 of the acoustic resonator 209 is greater than the thickness of the substrate 270 of the acoustic resonator 207. The thickness of the substrate (which includes a piezoelectric material) of the acoustic resonator help define the resonant frequencies of the acoustic resonator and how the acoustic resonator filters signals. Thus, different thicknesses produce acoustic resonators with different resonant frequencies and acoustic resonators that filter different frequencies. It is noted that the thicknesses for the substrates of the acoustic resonators are exemplary. In some implementations, two or more acoustic resonators may have substrates with the same thickness but have different designs, configurations and/or patterns for the metal layer(s). As will be further described below in at least FIGS. 12-14, two or more acoustic resonators (having different shapes and/or designs) may be coupled in series and/or parallel to provide at least one acoustic filter that can filter signals at specific frequencies, while keeping the size and form of the acoustic filter(s) as small and compact as possible.

The first metallization portion 204 is coupled to a first surface of the encapsulation layer 203. The first metallization portion 204 includes at least one dielectric layer 240 and a plurality of interconnects 244. The first metallization portion 204 may be a first redistribution portion. The plurality of interconnects 244 may include a plurality of redistribution interconnects. The plurality of interconnects 244 may be formed by at least one redistribution metal layer (RDL). A second metallization portion 206 is coupled to a second surface of the encapsulation layer 203. The second metallization portion 206 includes a dielectric layer 260 and a plurality of interconnects 264. The second metallization portion 206 may be a second redistribution portion. The plurality of interconnects 264 may include a plurality of redistribution interconnects. The plurality of interconnects 264 may be formed by at least one redistribution metal layer (RDL).

The plurality of interconnects 244 may be coupled to the at least one acoustic resonator 205, the at least one acoustic resonator 207, and/or the at least one acoustic resonator 209. For example, the plurality of interconnects 244 may be coupled to the first metal layer 254 of the acoustic resonator 205, the first metal layer 274 of the acoustic resonator 207 and the at least one interconnect 234 (which is coupled to the first metal layer 294 of the acoustic resonator 209).

The plurality of interconnects 264 may be coupled to the at least one acoustic resonator 205, the at least one acoustic resonator 207, and/or the at least one acoustic resonator 209. For example, the plurality of interconnects 264 may be coupled to the second metal layer 256 of the acoustic resonator 205, the at least one interconnect 236 (which is coupled to the second metal layer 276 of the acoustic resonator 207) and the second metal layer 296 of the acoustic resonator 209.

The plurality of interconnects 264 may be coupled to the plurality of interconnects 244 through the at least one interconnect 230. The plurality of interconnects 244 and/or the plurality of interconnects 264 allow the at least one acoustic resonator 205, the at least one acoustic resonator 207 and the at least one acoustic resonator 209 to be coupled together in series and/or parallel to provide at least one acoustic filter.

As shown in FIG. 2, the acoustic resonator 207 is located on a first side (e.g., top side) of the encapsulation layer 203 and the acoustic resonator 209 is located on a second side (e.g., bottom side) of the encapsulation layer 203. As will be further described below, a substrate may include several acoustic resonators with different designs, configurations, shapes, and/or thicknesses. A substrate is not limited to only three acoustic resonators. These acoustic resonators may be located differently in the encapsulation layer (e.g., 203).

Figure 3:
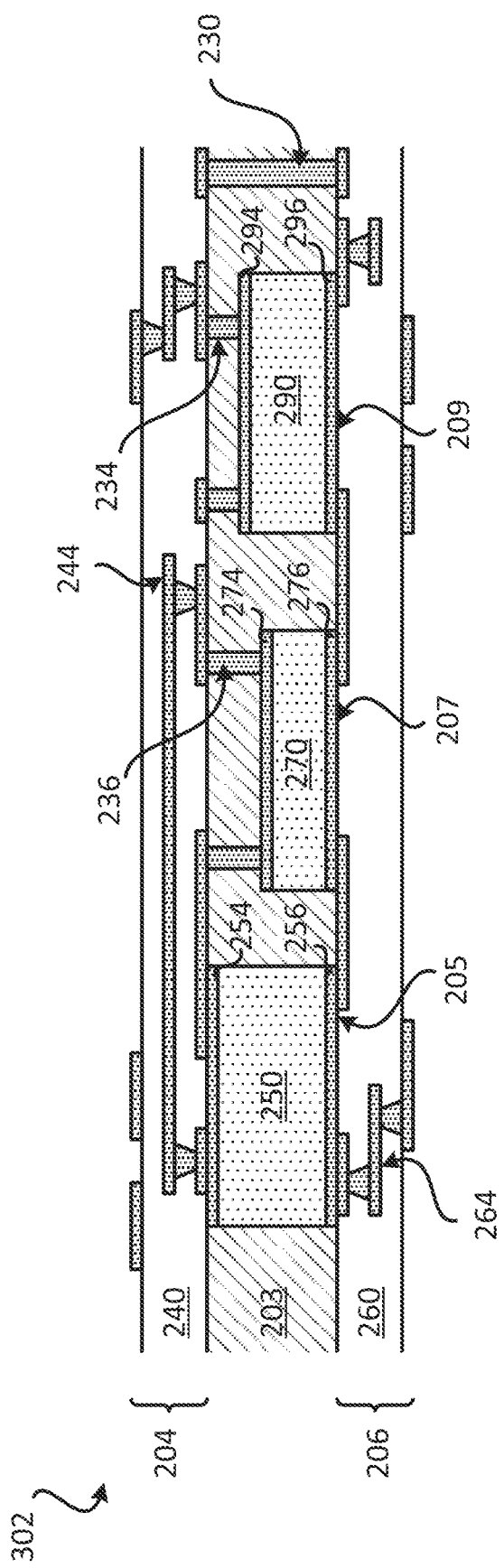
FIG. 3 illustrates a profile view of another exemplary substrate that includes acoustic resonators.

FIG. 3 illustrates a substrate 302 that includes the encapsulation layer 203, the first metallization portion 204, the second metallization portion 206, the at least one acoustic resonator 205, the at least one acoustic resonator 207, the at least one acoustic resonator 209, the at least one first dielectric layer 240, the at least one second dielectric layer 260, the plurality of first interconnects 244, the plurality of second interconnects 264, the at least one interconnect 230, the at least one interconnect 234, and the at least one interconnect 236. The substrate 302 is similar to the substrate 202. However, the substrate 302 includes acoustic resonators that are located differently in the encapsulation layer 203.

As shown in FIG. 3, the plurality of interconnects 244 may be coupled to the at least one acoustic resonator 205, the at least one acoustic resonator 207, and/or the at least one acoustic resonator 209. For example, the plurality of interconnects 244 may be coupled to the first metal layer 254 of the acoustic resonator 205, the at least one interconnect 236 (which is coupled to the first metal layer 274 of the acoustic resonator 207) and the at least one interconnect 234 (which is coupled to the first metal layer 294 of the acoustic resonator 209).

The plurality of interconnects 264 may be coupled to the at least one acoustic resonator 205, the at least one acoustic resonator 207, and/or the at least one acoustic resonator 209. For example, the plurality of interconnects 264 may be coupled to the second metal layer 256 of the acoustic resonator 205, the second metal layer 276 of the acoustic resonator 207 and the second metal layer 296 of the acoustic resonator 209. As shown in FIG. 3, the acoustic resonator 207 and the acoustic resonator 209 are located on a second side (e.g., bottom side) of the encapsulation layer 203.

Figure 4:
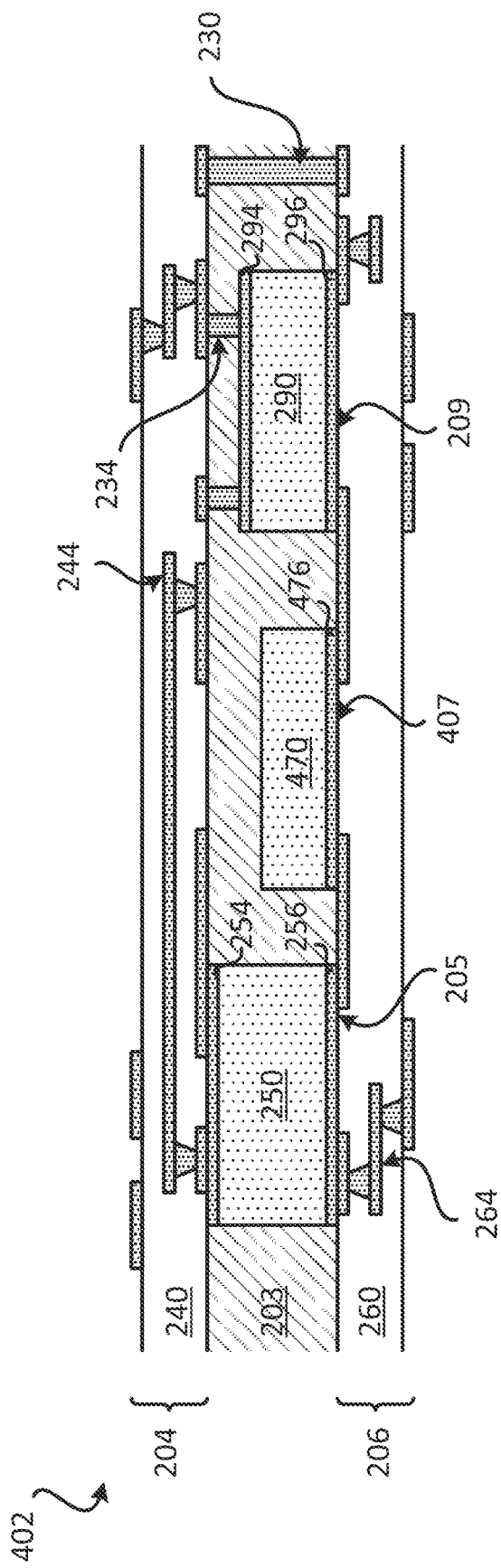
FIG. 4 illustrates a profile view of another exemplary substrate that includes acoustic resonators.

FIG. 4 illustrates a substrate 402 that includes the encapsulation layer 203, the first metallization portion 204, the second metallization portion 206, the at least one acoustic resonator 205, the at least one acoustic resonator 407, the at least one acoustic resonator 209, the at least one first dielectric layer 240, the at least one second dielectric layer 260, the plurality of first interconnects 244, the plurality of second interconnects 264, the at least one interconnect 230, and the at least one interconnect 234.

The substrate 402 is similar to the substrate 202. However, the substrate 402 includes different acoustic resonators that are located differently in the encapsulation layer 203. For example, the acoustic resonator 407 includes a substrate 470 and a metal layer 276. The substrate 470 may be a piezoelectric substrate. The substrate 470 may include a piezoelectric material (e.g., Aluminum Nitride (AlN), Lithium Niobate, Lithium Tantalate). The metal layer 476 may be configured as interconnects, electrodes and/or transducers.

As shown in FIG. 4, the plurality of interconnects 244 may be coupled to the at least one acoustic resonator 205, the at least one acoustic resonator 407, and/or the at least one acoustic resonator 209. For example, the plurality of interconnects 244 may be coupled to the first metal layer 254 of the acoustic resonator 205 and the at least one interconnect 234 (which is coupled to the first metal layer 294 of the acoustic resonator 209).

The plurality of interconnects 264 may be coupled to the at least one acoustic resonator 205, the at least one acoustic resonator 407, and/or the at least one acoustic resonator 209. For example, the plurality of interconnects 264 may be coupled to the second metal layer 256 of the acoustic resonator 205, the metal layer 476 of the acoustic resonator 407 and the second metal layer 296 of the acoustic resonator 209. As shown in FIG. 4, the acoustic resonator 407 and the acoustic resonator 209 are located on a second side (e.g., bottom side) of the encapsulation layer 203.

Figure 5:
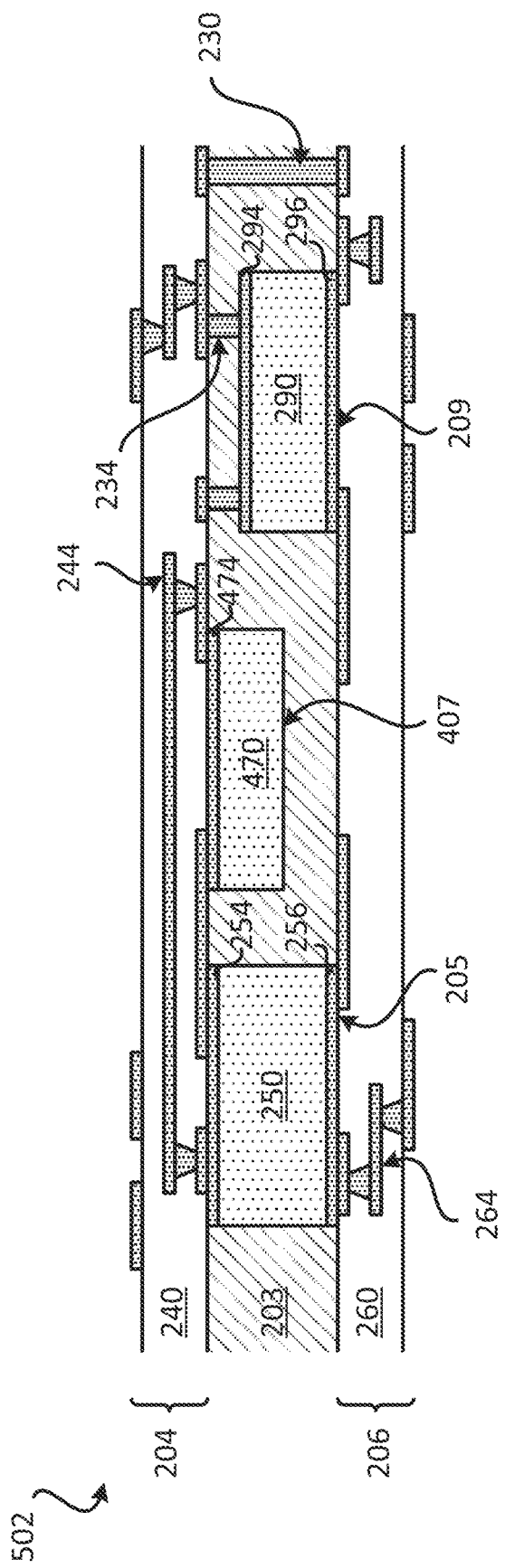
FIG. 5 illustrates a profile view of another exemplary substrate that includes acoustic resonators.

FIG. 5 illustrates a substrate 502 that includes the encapsulation layer 203, the first metallization portion 204, the second metallization portion 206, the at least one acoustic resonator 205, the at least one acoustic resonator 407, the at least one acoustic resonator 209, the at least one first dielectric layer 240, the at least one second dielectric layer 260, the plurality of first interconnects 244, the plurality of second interconnects 264, the at least one interconnect 230, and the at least one interconnect 234.

The substrate 502 is similar to the substrate 302. However, the substrate 502 includes different acoustic resonators that are located differently in the encapsulation layer. For example, the acoustic resonator 407 includes a substrate 470 and a metal layer 474. The metal layer 474 may be configured as interconnects, electrodes and/or transducers.

As shown in FIG. 5, the plurality of interconnects 244 may be coupled to the at least one acoustic resonator 205, the at least one acoustic resonator 407, and/or the at least one acoustic resonator 209. For example, the plurality of interconnects 244 may be coupled to the first metal layer 254 of the acoustic resonator 205, the metal layer 474 of the acoustic resonator 407, and the at least one interconnect 234 (which is coupled to the first metal layer 294 of the acoustic resonator 209).

The plurality of interconnects 264 may be coupled to the at least one acoustic resonator 205, the at least one acoustic resonator 407, and/or the at least one acoustic resonator 209. For example, the plurality of interconnects 264 may be coupled to the second metal layer 256 of the acoustic resonator 205, and the second metal layer 296 of the acoustic resonator 209. As shown in FIG. 5, the acoustic resonator 407 is located on a first side (e.g., top side) of the encapsulation layer 203 and the acoustic resonator 209 is located on a second side (e.g., bottom side) of the encapsulation layer 203.

Figure 6:
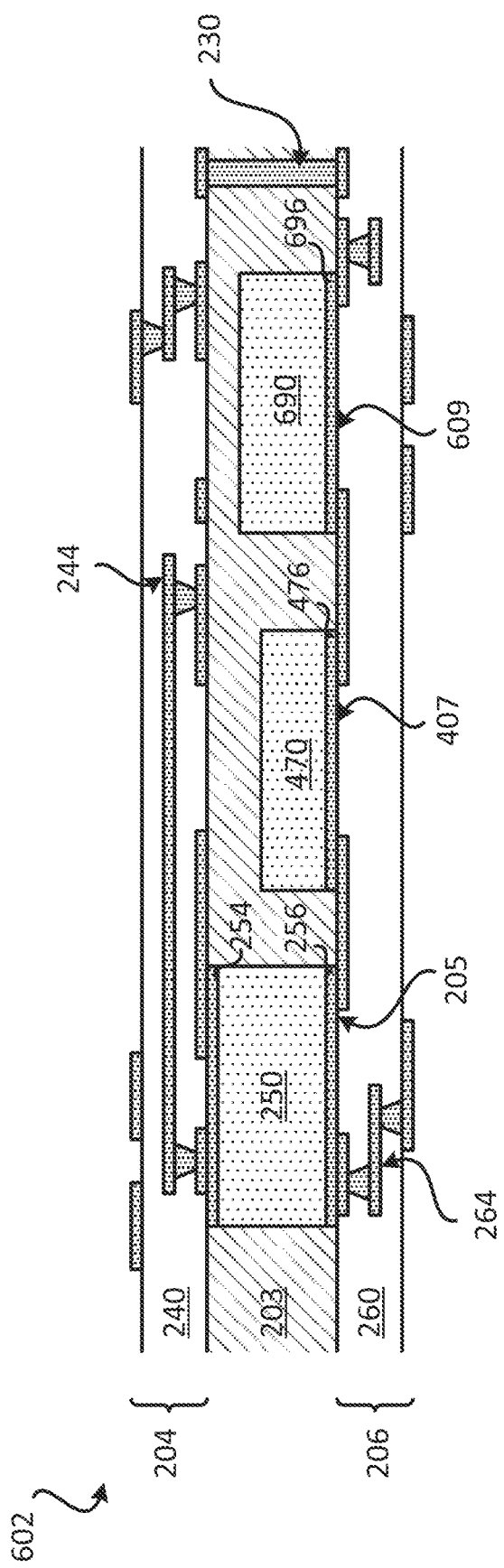
FIG. 6 illustrates a profile view of another exemplary substrate that includes acoustic resonators.

FIG. 6 illustrates a substrate 602 that includes the encapsulation layer 203, the first metallization portion 204, the second metallization portion 206, the at least one acoustic resonator 205, the at least one acoustic resonator 407, the at least one acoustic resonator 609, the at least one first dielectric layer 240, the at least one second dielectric layer 260, the plurality of first interconnects 244, the plurality of second interconnects 264, and the at least one interconnect 230.

The substrate 602 is similar to the substrate 302. However, the substrate 602 includes different acoustic resonators that are located differently in the encapsulation layer. The acoustic resonator 407 includes a substrate 470 and a metal layer 476. The substrate 470 may be a piezoelectric substrate. The substrate 470 may include a piezoelectric material (e.g., Aluminum Nitride (AlN), Lithium Niobate, Lithium Tantalate). The metal layer 474 may be configured as interconnects, electrodes and/or transducers.

The acoustic resonator 609 includes a substrate 690 and a metal layer 696. The substrate 690 may be a piezoelectric substrate. The substrate 690 may include a piezoelectric material (e.g., Aluminum Nitride (AlN), Lithium Niobate, Lithium Tantalate). The metal layer 696 may be configured as interconnects, electrodes and/or transducers.

As shown in FIG. 6, the plurality of interconnects 244 may be coupled to the at least one acoustic resonator 205, the at least one acoustic resonator 407, and/or the at least one acoustic resonator 609. For example, the plurality of interconnects 244 may be coupled to the first metal layer 254 of the acoustic resonator 205. The plurality of interconnects 264 may be coupled to the at least one acoustic resonator 205, the at least one acoustic resonator 407, and/or the at least one acoustic resonator 609. For example, the plurality of interconnects 264 may be coupled to the second metal layer 256 of the acoustic resonator 205, the metal layer 474 of the acoustic resonator 407 and the metal layer 696 of the acoustic resonator 609. As shown in FIG. 6, the acoustic resonator 407 and the acoustic resonator 609 are located on a second side (e.g., bottom side) of the encapsulation layer 203.

Figure 7:
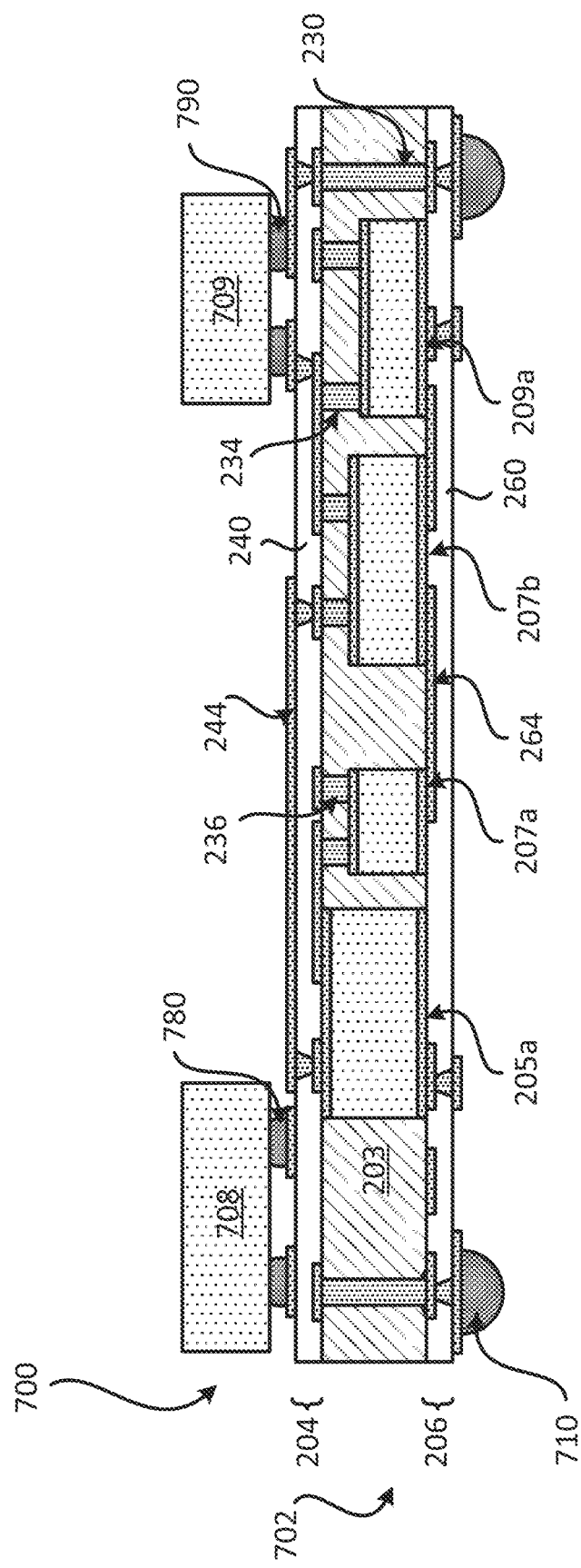
FIG. 7 illustrates a profile view of another exemplary package that includes a substrate implemented with acoustic resonators.

FIG. 7 illustrates a package 700 that includes a substrate 702, an integrated device 708 and an integrated device 709. The integrated device 708 is coupled to the substrate 702 through the plurality of solder interconnects 780. The integrated device 709 is coupled to the substrate 702 through the plurality of solder interconnects 790. The plurality of solder interconnects 780 and/or 790 are coupled to the plurality of interconnects 244 of the substrate 702. A plurality of solder interconnects 710 is coupled to the substrate 702. For example, the plurality of solder interconnects 710 is coupled to the plurality of interconnects 264 of the substrate 702.

The substrate 702 includes the encapsulation layer 203, the first metallization portion 204, the second metallization portion 206, an acoustic resonator 205a, an acoustic resonator 207a, an acoustic resonator 207b, an acoustic resonator 209a, the at least one first dielectric layer 240, the at least one second dielectric layer 260, the plurality of interconnects 244, the plurality of interconnects 264, the least one interconnect 230, at least one interconnect 234, and at least one interconnect 236.

The acoustic resonator 205a, the acoustic resonator 207a, the acoustic resonator 207b, and the acoustic resonator 209a are located in the encapsulation layer 203. The acoustic resonator 205a, the acoustic resonator 207a, the acoustic resonator 207b, and the acoustic resonator 209a may be configured to be coupled in series and/or parallel to operate as at least one acoustic filter. The integrated devices 708 and/or integrated device 709 may be coupled to the acoustic resonator 205a, the acoustic resonator 207a, the acoustic resonator 207b, and the acoustic resonator 209a through the plurality of interconnects 244, the at least one interconnect 230 and/or the plurality of interconnects 264.

Figure 8:
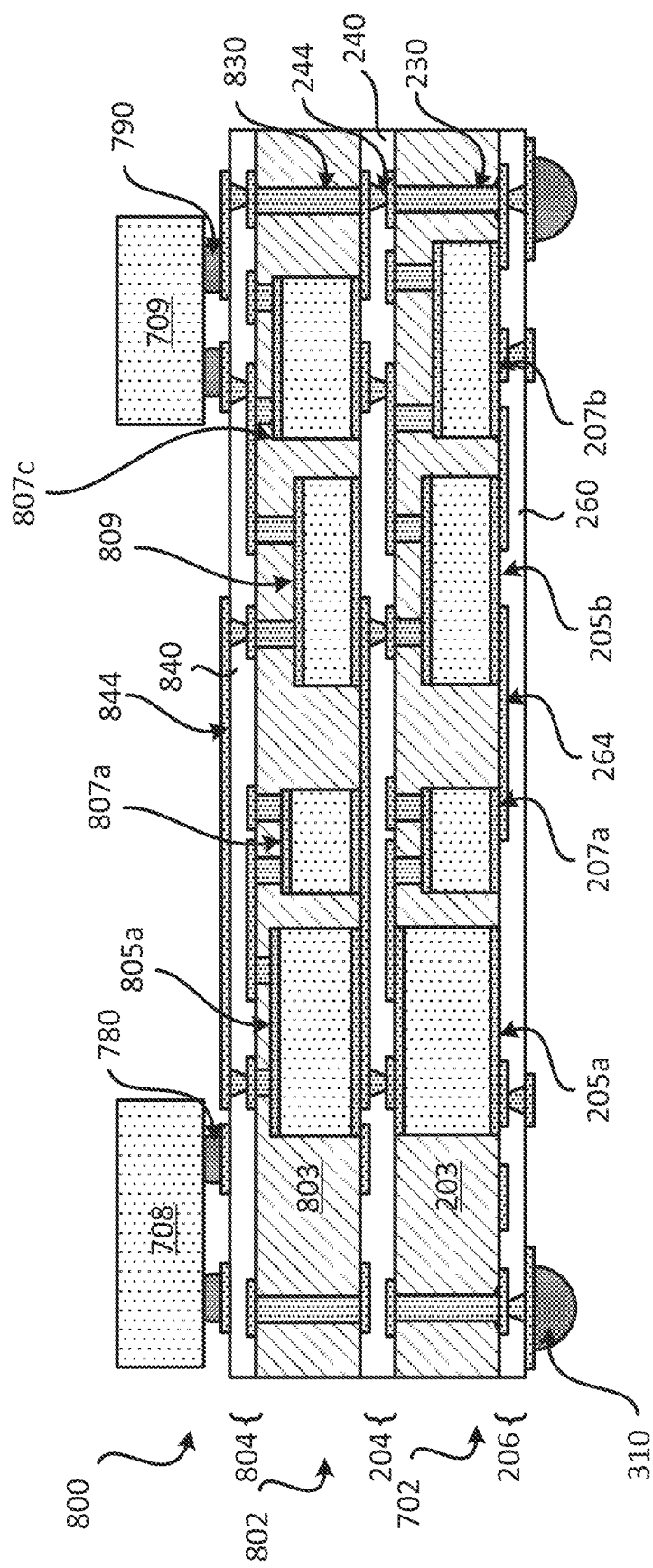
FIG. 8 illustrates a profile view of another exemplary package that includes a substrate implemented with acoustic resonators.

FIG. 8 illustrates a package 800 that includes the substrate 702, a substrate 802, the integrated device 708 and the integrated device 709. The integrated device 708 is coupled to the substrate 802 through the plurality of solder interconnects 780. The integrated device 709 is coupled to the substrate 802 through the plurality of solder interconnects 790. The plurality of solder interconnects 780 and/or 790 are coupled to the plurality of interconnects 844 of the substrate 802. A plurality of solder interconnects 710 is coupled to the substrate 702. For example, the plurality of solder interconnects 710 is coupled to the plurality of interconnects 264 of the substrate 702.

The substrate 702 includes the encapsulation layer 203, the first metallization portion 204, the second metallization portion 206, an acoustic resonator 205a, an acoustic resonator 207a, an acoustic resonator 207b, an acoustic resonator 209a, the at least one first dielectric layer 240, the at least one second dielectric layer 260, the plurality of interconnects 244, the plurality of interconnects 264, the least one interconnect 230, at least one interconnect 234, and at least one interconnect 236.

The acoustic resonator 205a, the acoustic resonator 207a, the acoustic resonator 207b, and the acoustic resonator 209a are located in the encapsulation layer 203. The acoustic resonator 205a, the acoustic resonator 207a, the acoustic resonator 207b, and the acoustic resonator 209a may be configured to be coupled in series and/or parallel to operate as at least one acoustic filter.

The substrate 802 is coupled to the substrate 702. The substrate 802 may be configured to be electrically coupled to the substrate 702 through the plurality of interconnects 244. The substrate 802 includes an encapsulation layer 803, the first metallization portion 804, an acoustic resonator 807a, an acoustic resonator 807b, an acoustic resonator 807c, an acoustic resonator 809a, the at least one first dielectric layer 840, a plurality of interconnects 844, at least one interconnect 830, at least one interconnect 834, and at least one interconnect 836. The first metallization portion 804 includes the at least one first dielectric layer 840 and the plurality of interconnects 844.

The acoustic resonator 807a, the acoustic resonator 807b, the acoustic resonator 807c, and the acoustic resonator 809a are located in the encapsulation layer 803. The acoustic resonator 807a, the acoustic resonator 807b, the acoustic resonator 807c, and the acoustic resonator 809a may be configured to be coupled in series and/or parallel to operate as at least one acoustic filter.

The integrated device 708 and/or integrated device 709 may be coupled to the acoustic resonator 205a, the acoustic resonator 207a, the acoustic resonator 207b, and the acoustic resonator 209a, the acoustic resonator 807a, the acoustic resonator 807b, the acoustic resonator 807c, and the acoustic resonator 809a through the plurality of interconnect 844, the at least one interconnect 830, the plurality of interconnects 244, the at least one interconnect 230 and/or the plurality of interconnects 264.

Although not shown, the package 800 may include at least one inductor and/or at least one capacitor. The at least one inductor and/or at least one capacitor may be configured to be coupled to the acoustic resonator 205a, the acoustic resonator 207a, the acoustic resonator 207b, and the acoustic resonator 209a, the acoustic resonator 807a, the acoustic resonator 807b, the acoustic resonator 807c, and the acoustic resonator 809a. The at least one inductor and/or at least one capacitor may be at least one surface mounted device (SMD) that is coupled to the substrate (e.g., 802, 702). The at least one inductor and/or at least one capacitor may be passive integrated devices (e.g., passive dies). The at least one inductor and/or the at least one capacitor may be defined by at least one interconnect located in the first metallization portion 804, the first metallization portion 204 and/or the second metallization portion 206. For example, the at least one inductor and/or the at least one capacitor may be defined by interconnects from the plurality of interconnects 844, the plurality of interconnects 244 and/or the plurality of interconnects 264.

The at least one inductor, at least one capacitor, the acoustic resonator 205a, the acoustic resonator 207a, the acoustic resonator 207b, and the acoustic resonator 209a, the acoustic resonator 807a, the acoustic resonator 807b, the acoustic resonator 807c, and/or the acoustic resonator 809a may be configured to be define and operate as a duplexer.

Figure 9:
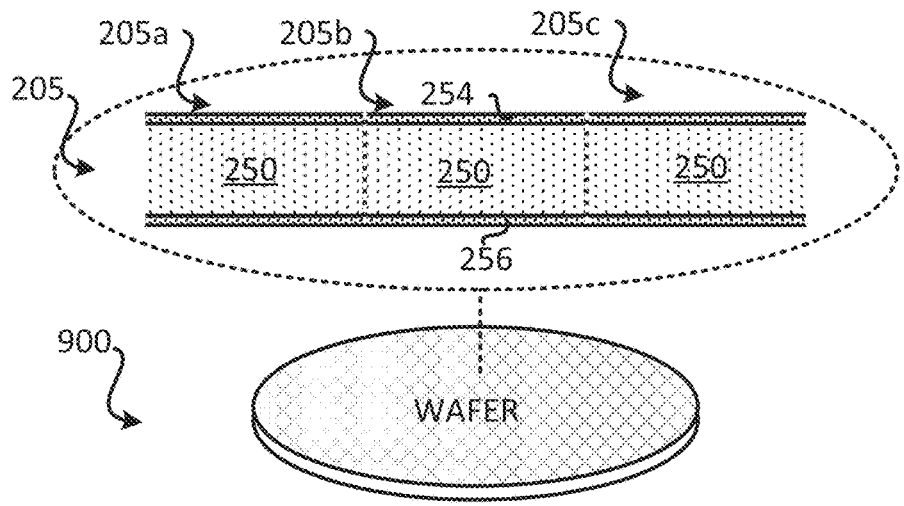
FIG. 9 illustrates a wafer that includes acoustic resonators.
Figure 10:
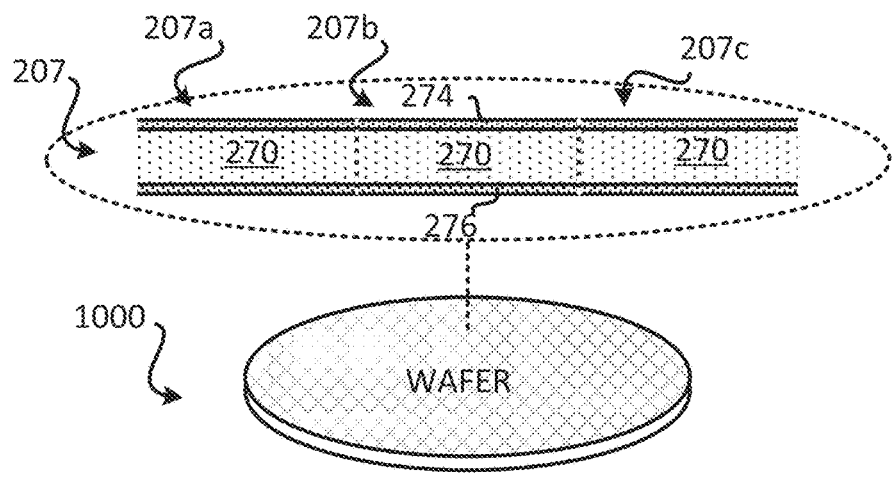
FIG. 10 illustrates a wafer that includes acoustic resonators.
Figure 11:
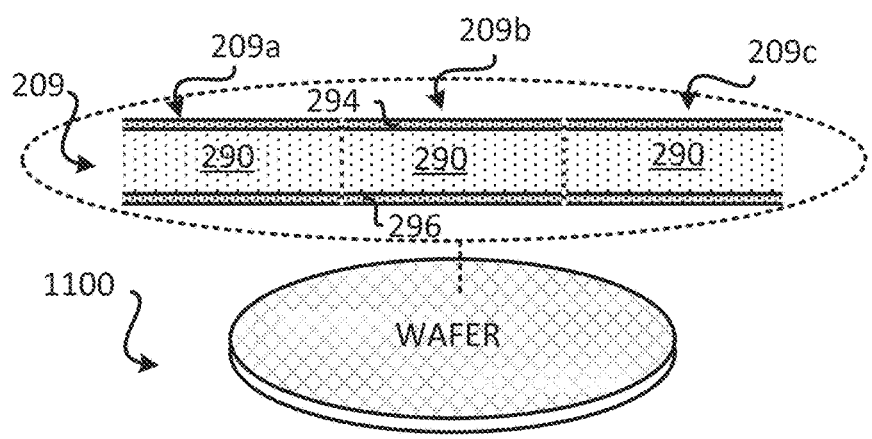
FIG. 11 illustrates a wafer that includes acoustic resonators.

Various acoustic resonators having various shapes, sizes, thicknesses, configurations and/or designs may be fabricated and then combined to be located in an encapsulation layer of a substrate. FIGS. 9-11 illustrate several wafers that each include a plurality of different acoustic resonators.

FIG. 9 illustrates a wafer 900 that includes a plurality of acoustic resonators 205. As shown in FIG. 9, the plurality of acoustic resonators 205 includes a first acoustic resonator 205a, a second acoustic resonator 205b and a third acoustic resonator 205c. Each acoustic resonator (e.g., 205a, 205b, 205c) includes a substrate 250, a first metal layer 254 and a second metal layer 256. The substrate 250 includes a piezoelectric material. The substrate 250 may include a piezoelectric substrate. The plurality of acoustic resonators 205 may be fabricated together and then singulated into individual acoustic resonators (e.g., 205a, 205b, 205c).

FIG. 10 illustrates a wafer 1000 that includes a plurality of acoustic resonators 207. As shown in FIG. 10, the plurality of acoustic resonators 207 includes a first acoustic resonator 207a, a second acoustic resonator 207b and a third acoustic resonator 207c. Each acoustic resonator (e.g., 207a, 207b, 207c) includes a substrate 270, a first metal layer 274 and a second metal layer 276. The substrate 270 includes a piezoelectric material. The substrate 270 may include a piezoelectric substrate. The plurality of acoustic resonators 207 may be fabricated together and then singulated into individual acoustic resonators (e.g., 207a, 207b, 207c).

FIG. 11 illustrates a wafer 1100 that includes a plurality of acoustic resonators 209. As shown in FIG. 11, the plurality of acoustic resonators 209 includes a first acoustic resonator 209a, a second acoustic resonator 209b and a third acoustic resonator 209c. Each acoustic resonator (e.g., 209a, 209b, 209c) includes a substrate 290, a first metal layer 294 and a second metal layer 296. The substrate 290 includes a piezoelectric material. The substrate 290 may include a piezoelectric substrate. The plurality of acoustic resonators 209 may be fabricated together and then singulated into individual acoustic resonators (e.g., 209a, 209b, 209c).

FIGS. 9-11 illustrate three acoustic resonators with different thicknesses. However, the acoustic resonators are not limited to three resonators with different substrate thicknesses. There could be a fourth resonator with a fourth substrate thickness, a fifth resonator with a fifth substrate thickness, a sixth resonator with a sixth substrate thickness, a seventh resonator with a seventh substrate thickness, an eighth resonator with an eighth substrate thickness, etc. FIGS. 9-11 illustrate that the acoustic resonators 205, 207 and 209 have different substrate thicknesses. These different substrate thicknesses may affect the resonant frequencies of the acoustic resonators and how the acoustic resonators filter signals at different frequencies.

Figure 12:
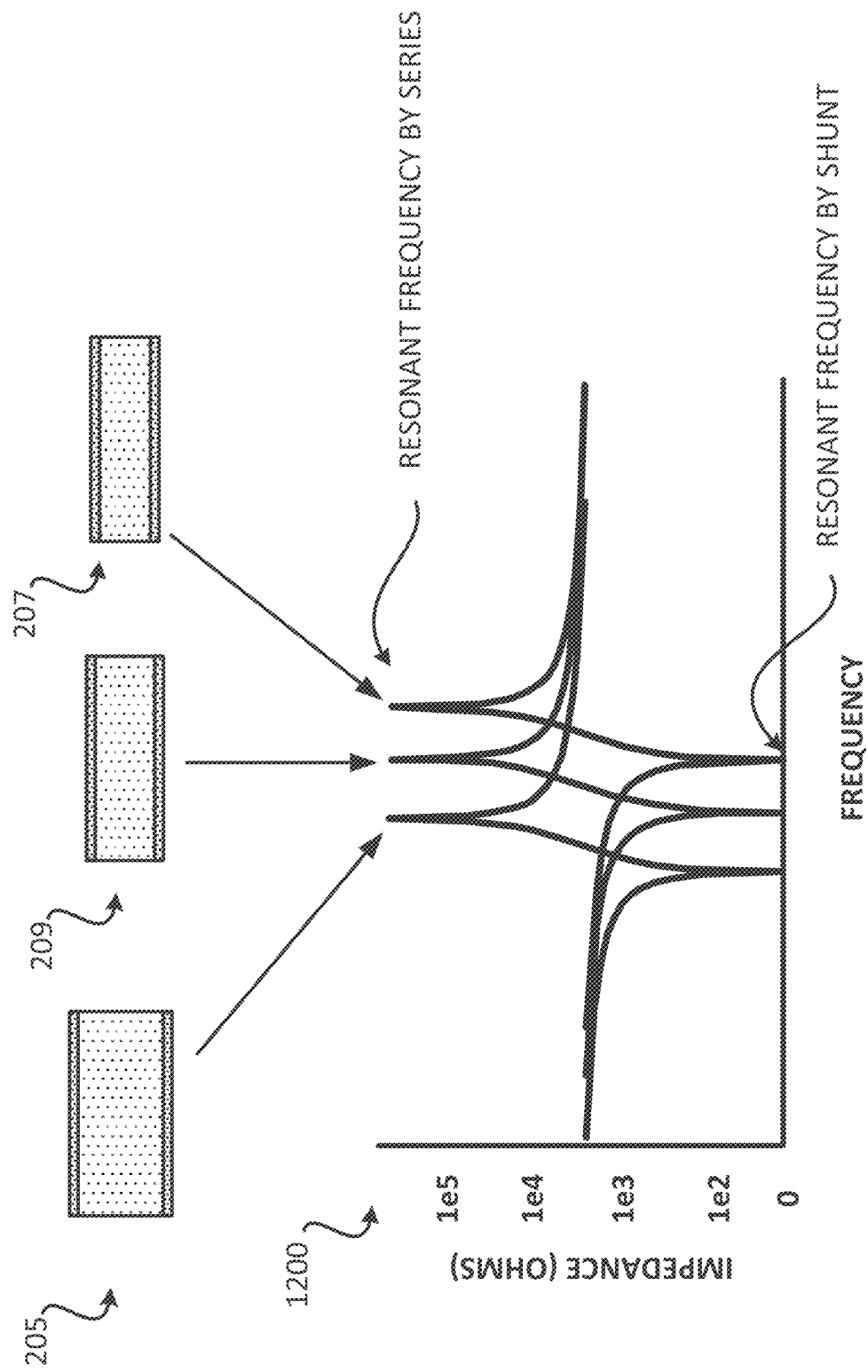
FIG. 12 illustrates an exemplary graph of resonant frequencies for different acoustic resonators.

FIG. 12 illustrates how different acoustic resonators may generate different resonant frequencies. FIG. 12 illustrates signal profiles across frequencies for various acoustic resonators 205, 207 and 209. FIG. 12 illustrates that using different substrate thicknesses helps control and/or specify the resonator frequency(ies) of the acoustic resonators. FIG. 12 illustrates a graph 1200 that shows an exemplary impedance and frequency relationship for various acoustic resonators (e.g., 205, 207, 209). The resonant frequency of an acoustic resonator may be expressed by the following equation:

$$\text{fresonance} \approx \frac{1}{2 \cdot T} \sqrt{\frac{E}{p}},$$

where E is the Young's Modulus of the piezoelectric material, p is the density of the piezoelectric material, and T is the thickness of piezoelectric material. Thus, a thicker piezoelectric material produces a lower resonant frequency, while a thinner piezoelectric material produces a higher resonant frequency.

Figure 13:
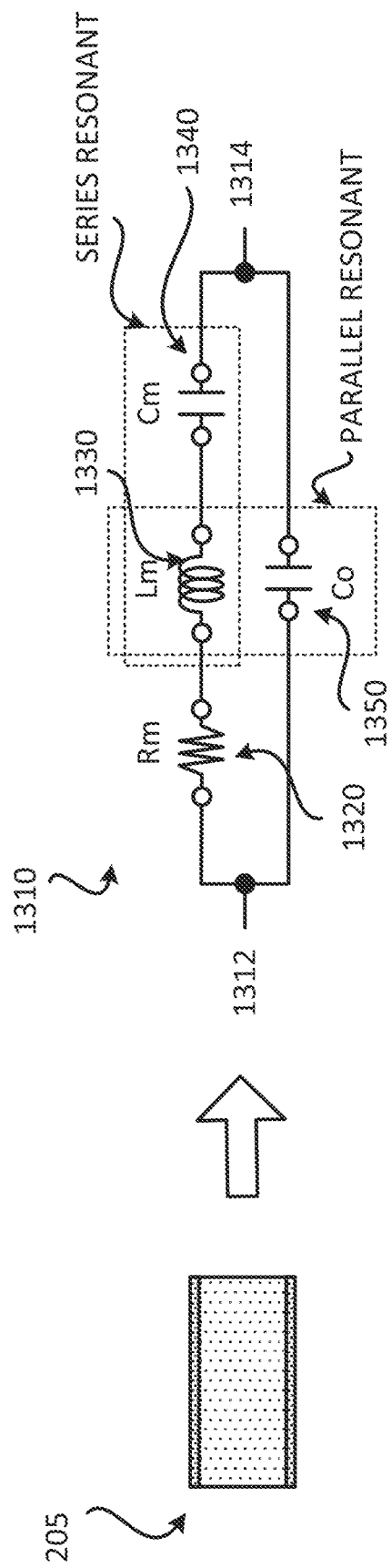
FIG. 13 illustrates an exemplary equivalent electrical circuit for an acoustic resonator.

As will be further described in FIG. 13, an acoustic resonator may be represented by an equivalent series circuit and an equivalent parallel circuit. In FIG. 12, the equivalent series circuit (e.g., series resonant circuit) has zero impedance at resonant frequency while the equivalent parallel circuit (e.g., parallel resonant circuit) may have an infinitive number (e.g., at the resonant frequency by shunt) for impedance.

FIG. 13 illustrates an equivalent electrical circuit 1310 for an acoustic resonator (e.g., 205, 207, 209, etc.). The equivalent electrical circuit 1310 includes a first port 1312 (e.g., first electrode) a second port 1314 (e.g., second electrode), a resistor 1320, an inductor 1330, a capacitor 1340 and a capacitor 1350. The resistor 1320, the inductor 1330 and the capacitor 1340 are configured to be coupled in series. The capacitor 1350 is configured to be coupled in parallel to the resistor 1320, the inductor 1330 and the capacitor 1340. The inductor 1330 and the capacitor 1340 may help provide series resonant for the equivalent electrical circuit 1310. The inductor 1130 and the capacitor 1350 may help provide parallel resonant for the circuit 1310.

Figure 14:
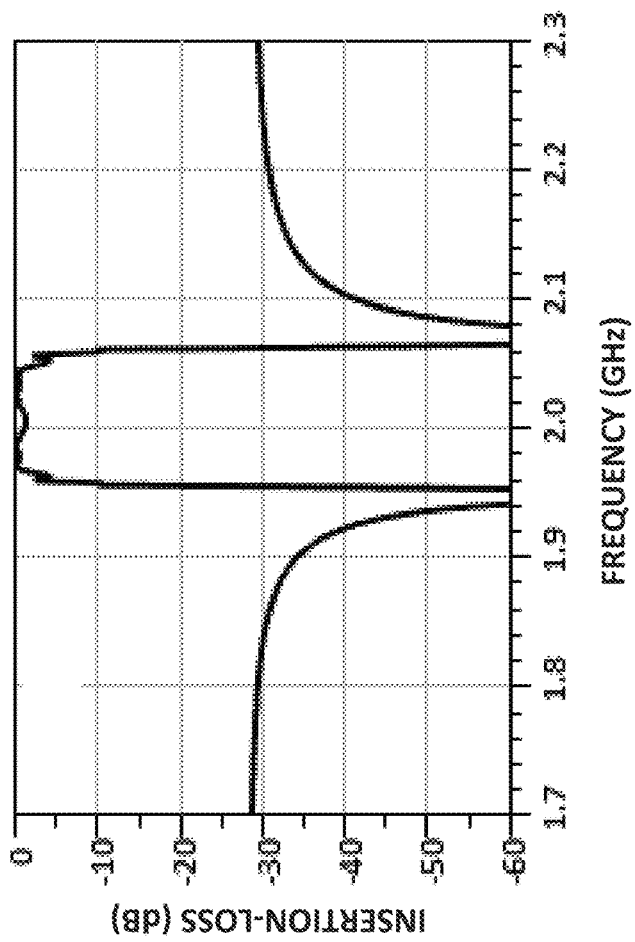
FIG. 14 illustrates an exemplary graph of how several acoustic resonators may filter signals.
Figure 14:
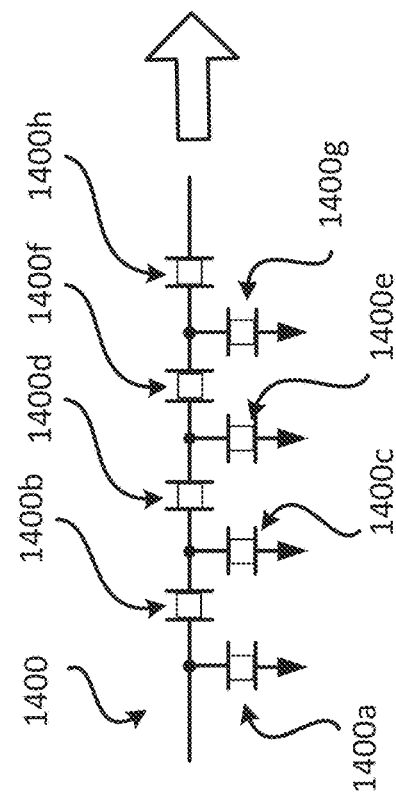

FIG. 14 illustrates how combining several acoustic resonators can be used to provide an acoustic filter for a specified range of frequencies. FIG. 14 illustrates a plurality of acoustic resonators 1400 used in combination (e.g., series and parallel) to provide acoustic filtering. In the example of FIG. 14, signals in a range of approximately 1.96-2.06 Gigahertz (GHz) pass through, while signals out of that range are filtered out by the plurality of acoustic resonators 1400. However, different numbers of acoustic resonators with different configurations, shapes, sizes and/or thicknesses may be used to target a specific range of frequencies.

Each of the acoustic resonator from the plurality of acoustic resonators 1400 may be any of the acoustic resonators described in the disclosure. The plurality of acoustic resonators 1400 include a first acoustic resonator 1400a, a second acoustic resonator 1400b, a third acoustic resonator 1400c, a fourth acoustic resonator 1400d, a fifth acoustic resonator 1400e, a sixth acoustic resonator 1400f, a seventh acoustic resonator 1400g and an eighth acoustic resonator 1400h.

The first acoustic resonator 1400a, the third acoustic resonator 1400c, the fifth acoustic resonator 1400e and the seventh acoustic resonator 1400g may be coupled together in parallel. The first acoustic resonator 1400a, the third acoustic resonator 1400c, the fifth acoustic resonator 1400e and the seventh acoustic resonator 1400g may be coupled together in Shunt. The second acoustic resonator 1400b, a fourth acoustic resonator 1400d, a sixth acoustic resonator 1400f, and the eighth acoustic resonator 1400h may be configured to be coupled together in series.

Exemplary Sequence for Fabricating a Substrate that Includes Acoustic Resonators In some implementations, fabricating a substrate that includes acoustic resonators includes several processes. FIGS. 15A-15F illustrate an exemplary sequence for providing or fabricating a substrate that includes acoustic resonators. In some implementations, the sequence of FIGS. 15A-15F may be used to provide or fabricate the substrates 202, 702, and/or 802. However, the process of FIGS. 15A-15F may be used to fabricate any of the substrates described in the disclosure.

It should be noted that the sequence of FIGS. 15A-15F may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Figure 15A:
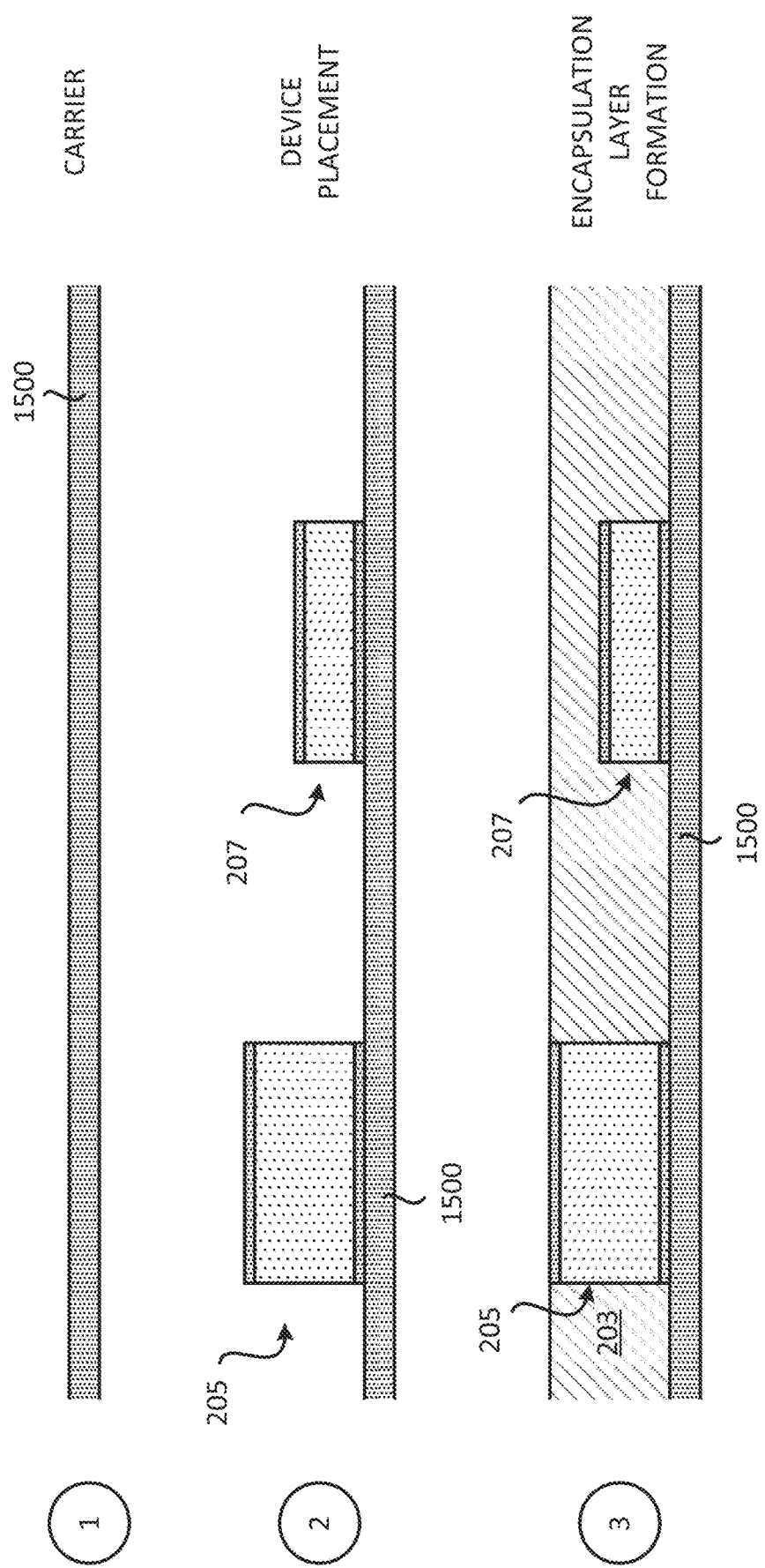
FIG. 15A-15F illustrate an exemplary sequence for fabricating a substrate that includes a plurality of acoustic resonators.

Stage 1, as shown in FIG. 15A, illustrates a state after a carrier 1500 is provided. The carrier 1500 may include a substrate.

Stage 2 illustrates a state after a plurality of acoustic resonators 205 (e.g., 205a, 205b) and a plurality of acoustic resonators 207 (e.g., 207a, 207b) are placed over the carrier 1500. The plurality of acoustic resonators 205 and/or the plurality of acoustic resonators 207 may be placed using a pick and place process. Different implementations may provide a different number of acoustic resonators with different designs, shapes, thicknesses and/or configurations.

Stage 3 illustrates a state after an encapsulation layer 203 is formed over the carrier 1500. A compression and transfer molding process, a sheet molding process, or a liquid molding process may be used to form the encapsulation layer 203. The encapsulation layer 203 may at least partially encapsulate the plurality of acoustic resonators 205 and the plurality of acoustic resonators 207. In some implementations, the encapsulation layer 203 may be formed over the plurality of acoustic resonators 205 and the plurality of acoustic resonators 207, and portions of the encapsulation layer 203 may be removed (e.g. grinded) such that a top surface of the encapsulation layer 203 is co-planar with the plurality of acoustic resonators 205 and/or the plurality of acoustic resonators 207. The encapsulation layer 203 may include a mold, a resin and/or an epoxy. The encapsulation layer 203 may be a means for encapsulation. The encapsulation layer 203 may be photo etchable.

Figure 15B:
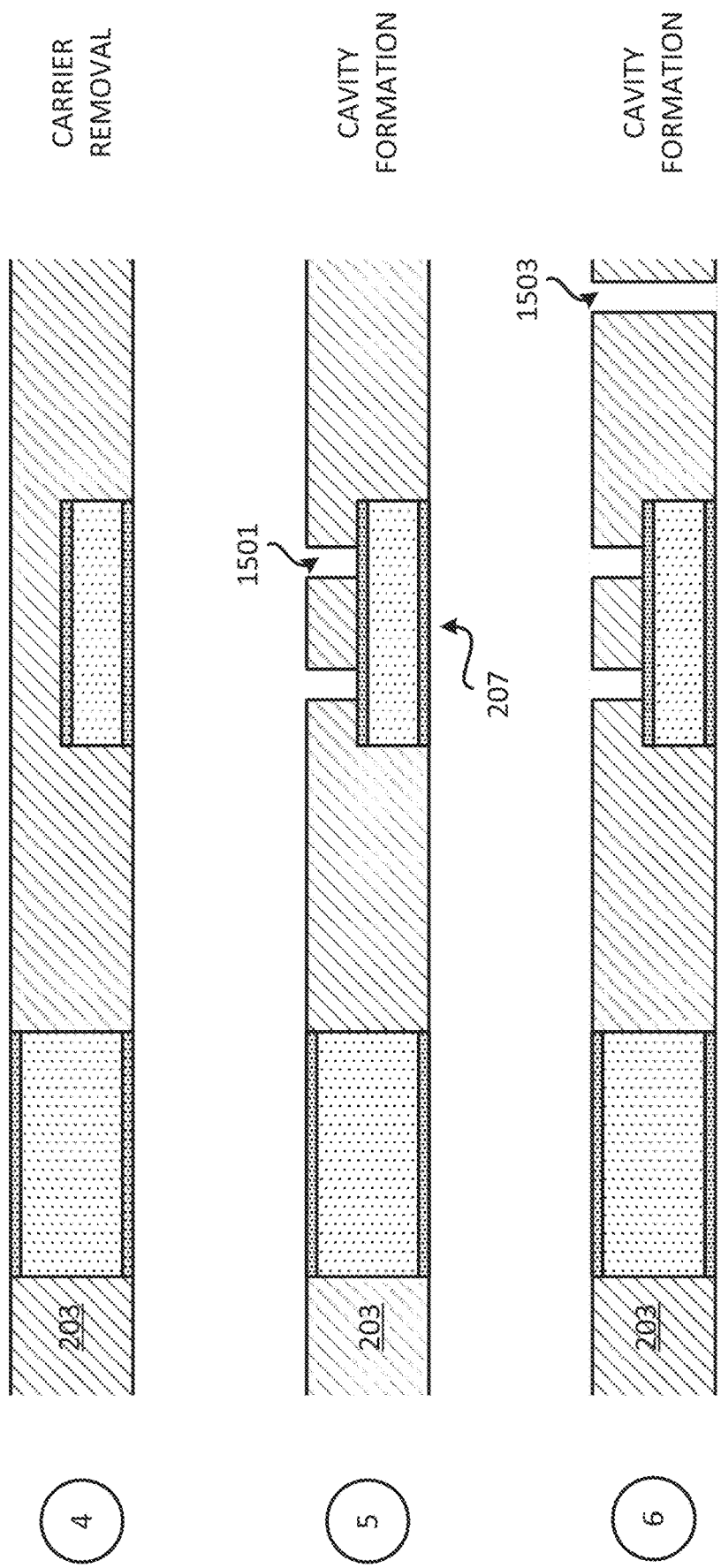

Stage 4, as shown in FIG. 15B, illustrates a state after the carrier 1500 is decoupled from the encapsulation layer 203 and the plurality of acoustic resonators 205 and the plurality of acoustic resonators 207. Decoupling the carrier 1500, may include removing, detaching, grinding and/or dissolving the carrier 1500 using a mechanical process and/or a chemical process.

Stage 5 illustrates a state after a plurality of cavities 1501 is formed in the encapsulation layer 203. A laser process (e.g., laser ablation), a lithography process (e.g., exposure and development), or an etching process may be used to form the cavities 1501. The plurality of cavities 1501 may be formed over with the plurality of acoustic resonators 205 and/or the plurality of acoustic resonators 207. The plurality of cavities 1501 may extend through part of the thickness of the encapsulation layer 203.

Stage 6 illustrates a state after a plurality of cavities 1503 is formed in the encapsulation layer 203. A laser process (e.g., laser ablation), a lithography process (e.g., exposure and development), or an etching process may be used to form the cavities 1503. The plurality of cavities 1503 may extend through the entire thickness of the encapsulation layer 203.

Figure 15C:
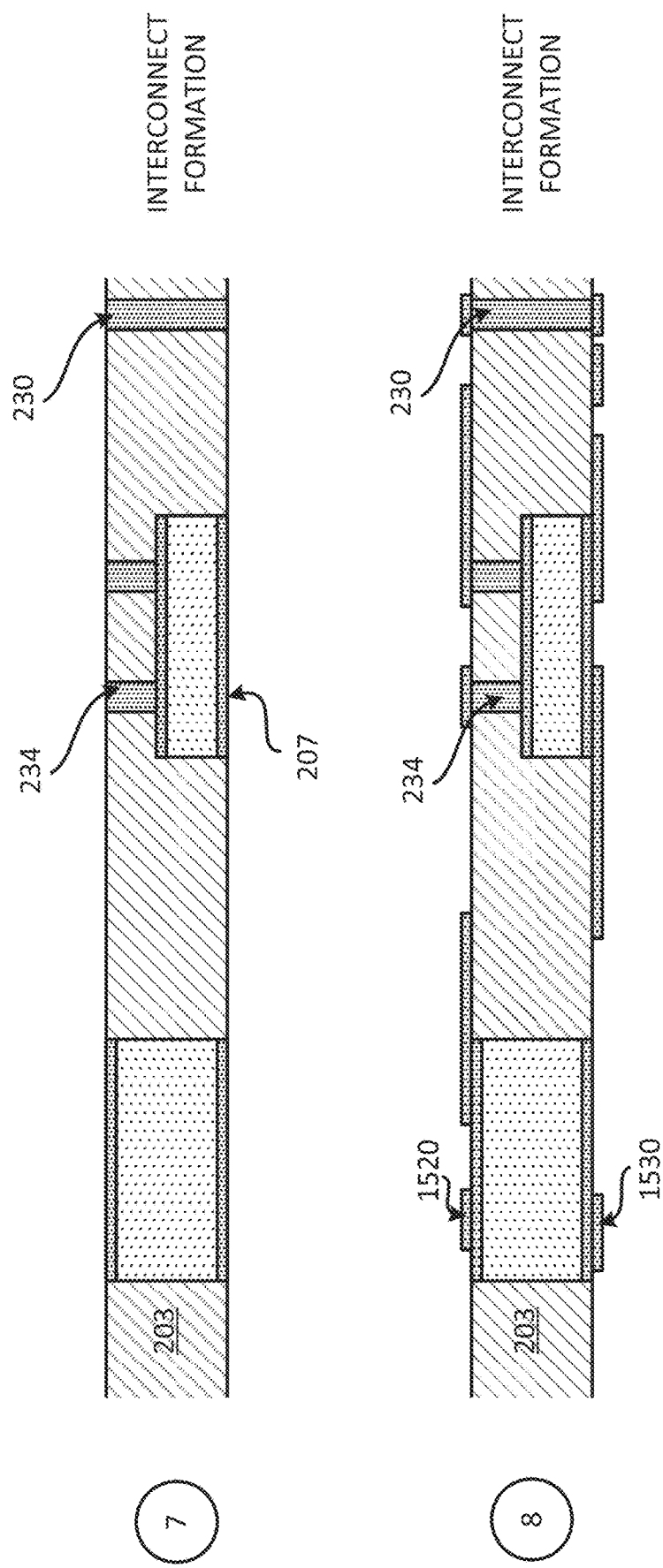

Stage 7, as shown in FIG. 15C, illustrates a state after a plurality of interconnects 230 and 234 are formed in the plurality of cavities 1501 and/or plurality of 1503. A plating process or a pasting process may be used to (i) form the interconnects 230 in the cavities 1503 and (ii) form the interconnects 234 in the cavities 1501. The plurality of interconnects 230 may extend through the encapsulation layer 203. The plurality of interconnects 234 may be coupled to the plurality of acoustic resonators 207. The plurality of interconnects 234 may be coupled to a metal layer (e.g., 274) of the plurality of acoustic resonators 207. The plurality of interconnects 230 and 234 may include vias (e.g., via interconnects) that extend partially and/or completely though the encapsulation layer 203.

Stage 8 illustrates a state after (i) a plurality of interconnects 1520 is formed over a first surface of the encapsulation layer 203 and (ii) a plurality of interconnects 1530 is formed over a second surface of the encapsulation layer 203. A patterning process and a plating process may be used to form the plurality of interconnects 1520 and 1530. The plurality of interconnects 1520 and 1530 may be coupled to the plurality of interconnects 230 and/or 234. Some of the interconnects from the plurality of interconnects 1520 and 1530 may be coupled to the acoustic resonators 205 and 207. For example, some of the interconnects from the plurality of interconnects 1520 and 1530 may be coupled to interconnects (e.g. 254, 256) of the acoustic resonators 205 and/or the interconnects (e.g. 274, 276) of the acoustic resonators 207.

Figure 15D:
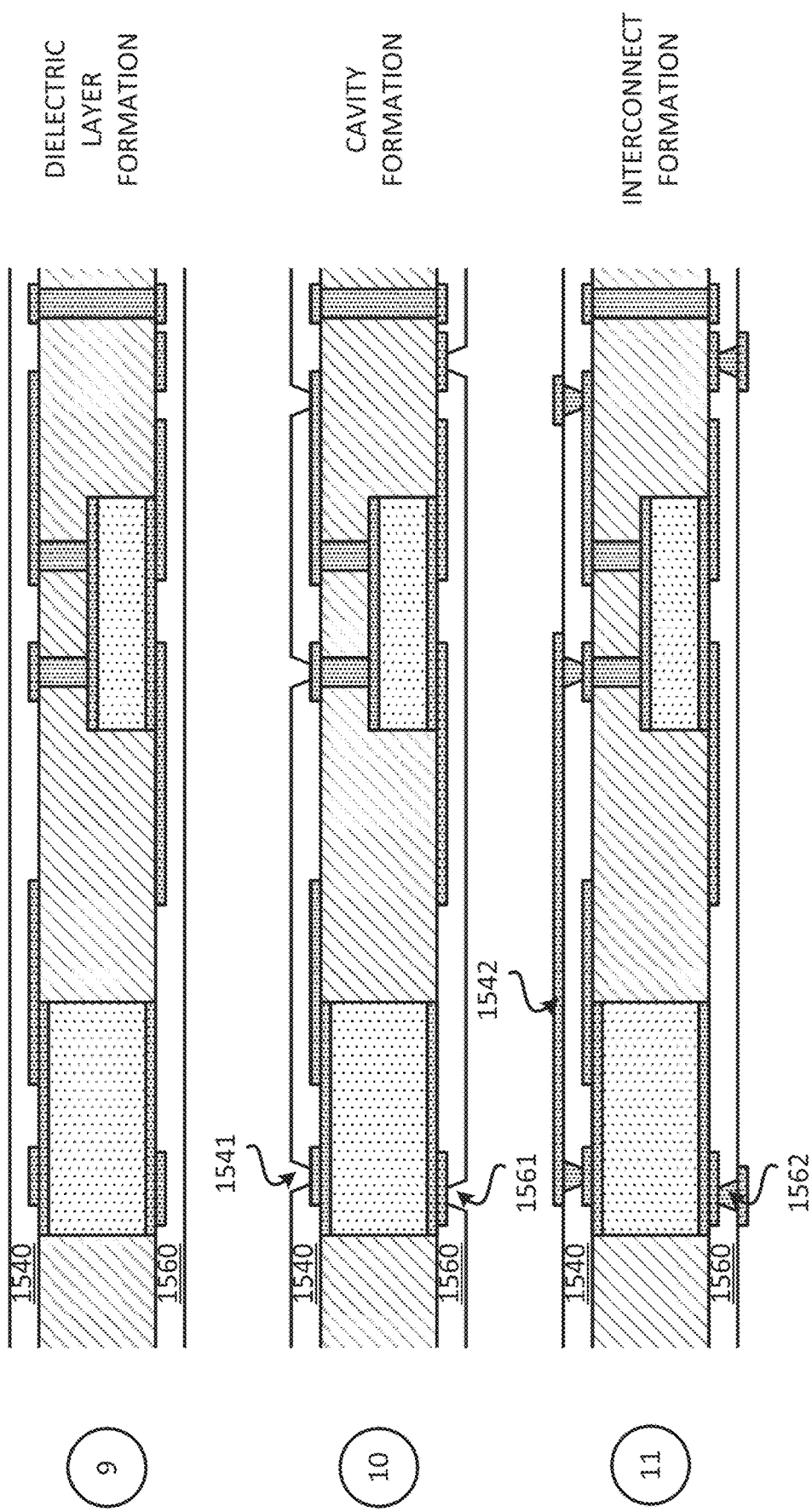

Stage 9, as shown in FIG. 15D, illustrates a state after (i) a dielectric layer 1540 is formed over the first surface of the encapsulation layer 203, the acoustic resonators (e.g., 205) and the plurality of interconnects 1520, and (ii) a dielectric layer 1560 is formed over the second surface of the encapsulation layer 203, the acoustic resonators (e.g., 205) and the plurality of interconnects 1530. A deposition process may be used to form the dielectric layers 1540 and 1560. The dielectric layers 1540 and 1560 may include polyimide. However, different implementations may use different materials for the dielectric layers 1540 and 1560.

Stage 10 illustrates after a plurality of cavities 1541 is formed in the dielectric layer 1540 and a plurality of cavities 1561 is formed in the dielectric layer 1560. A laser process (e.g., laser ablation), a lithography process (e.g., exposure and development), or an etching process may be used to form the cavities 1541 and 1561.

Stage 11 illustrates a state after (i) a plurality of interconnects 1542 is formed in and/or over the dielectric layer 1540, and (ii) a plurality of interconnects 1562 is formed in and/or over the dielectric layer 1560. A patterning process and a plating process may be used to form the interconnects 1542 and 1562. Some of the interconnects 1542 may be formed in the cavities 1541. Some of the interconnects 1562 may be formed in the cavities 1561. The interconnects 1542 and 1562 may include vias, pads and/or traces. The interconnects 1520 and 1542 may be represented by the plurality of interconnects 244. The interconnects 1530 and 1562 may be represented by the plurality of interconnects 264. The plurality of interconnects (e.g., 1520, 1542) and/or the plurality of interconnects (1530, 1562) may include redistribution interconnects. The plurality of interconnects (e.g., 1520, 1542) and/or the plurality of interconnects (1530, 1562) may be fabricated using a redistribution layer (RDL) fabrication process.

Figure 15E:
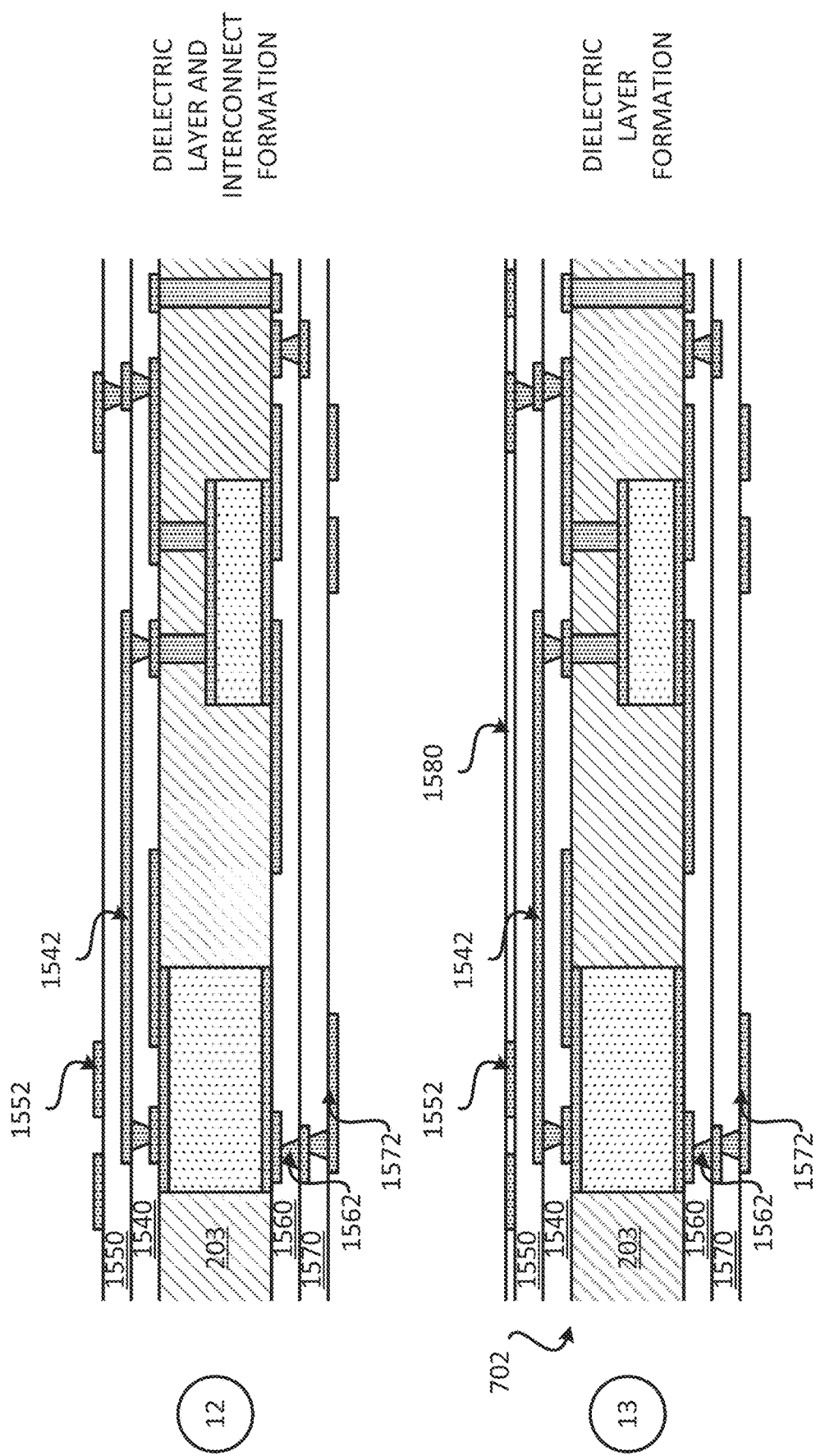

Stage 12, as shown in FIG. 15E, illustrates a state after (i) a dielectric layer 1550, a plurality of interconnects 1552 is formed in and/or over the dielectric layer 1550, and (ii) a dielectric layer 1570, a plurality of interconnects 1572 is formed in and/or over the dielectric layer 1570. The dielectric layer 1550 is located over the dielectric layer 1540. The plurality of interconnects 1552 is coupled to the plurality of interconnects 1542. The dielectric layer 1570 is located over the dielectric layer 1560. The plurality of interconnects 1572 is coupled to the plurality of interconnects 1562. The process of forming the dielectric layers (e.g., 1550, 1570) and the plurality of interconnects (e.g., 1552, 1572) may be similar as the process described at Stages 9-11 of FIG. 15D. A deposition process may be used to form the dielectric layers 1550 and 1570. The dielectric layers 1550 and 1570 may include polyimide. A patterning process and a plating process may be used to form the interconnects 1552 and 1572. Some of the interconnects 1552 and/or 1572 may be formed in cavities of the dielectric layers 1550 and/or 1570. Stage 12 may illustrate the substrate 202 of FIG. 2.

Stage 13 illustrates a state a dielectric layer 1580 is formed over the dielectric layer 1550. A deposition process may be used to form the dielectric layer 1580. The dielectric layer 1580 may include polyimide. Stage 13 may illustrate the substrate 702 of FIG. 7.

Figure 15F:
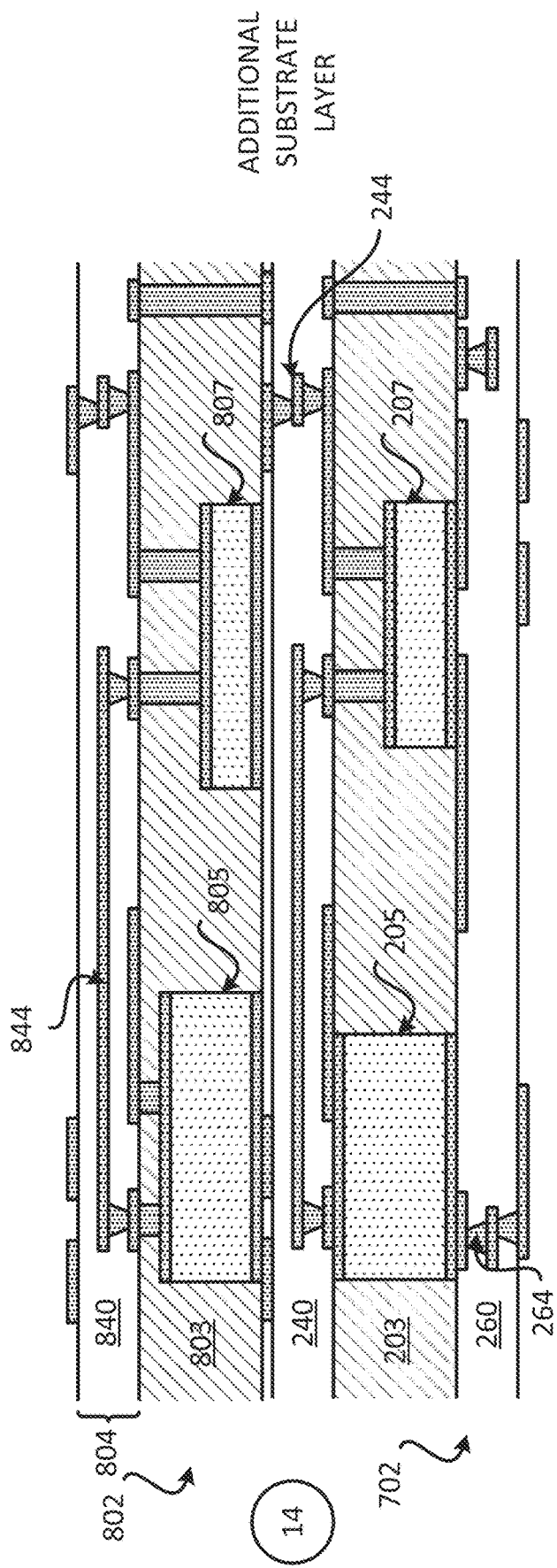

Stage 14, as shown in FIG. 15F, illustrates a state after another substrate 802 is coupled to the substrate 702. The substrate 702 includes the encapsulation layer 203, the acoustic resonator 205, the acoustic resonator 207, the at least one dielectric layer 240, the plurality of interconnects 244, the at least one dielectric layer 260, the plurality of interconnects 264. The at least one dielectric layer 240 may represent the dielectric layer 1540, 1550 and/or 1580. The plurality of interconnects 244 may represent the plurality of interconnects 1542 and 1552. The at least one dielectric layer 260 may represent the dielectric layer 1560 and/or 1570. The plurality of interconnects 264 may represent the plurality of interconnects 1562 and 1572.

The substrate 802 may include a metallization portion 804, a plurality of acoustic resonators 805, a plurality of acoustic resonators 807, an encapsulation layer 803, at least one dielectric layer 840, and a plurality of interconnects 842. The substrate 802 may be formed in a similar fashion as described for the substrate 702. The substrate 802 may be formed over the substrate 702. For example, the acoustic resonators 805 and acoustic resonators may be placed over the at least one dielectric layer 240 and the encapsulation layer 803 is formed over the at least one dielectric layer 240. The metallization portion 804 may be formed over the encapsulation layer 803. The metallization portion 804 includes the at least one dielectric layer 840 and the plurality of interconnects 844.

Figure 16:
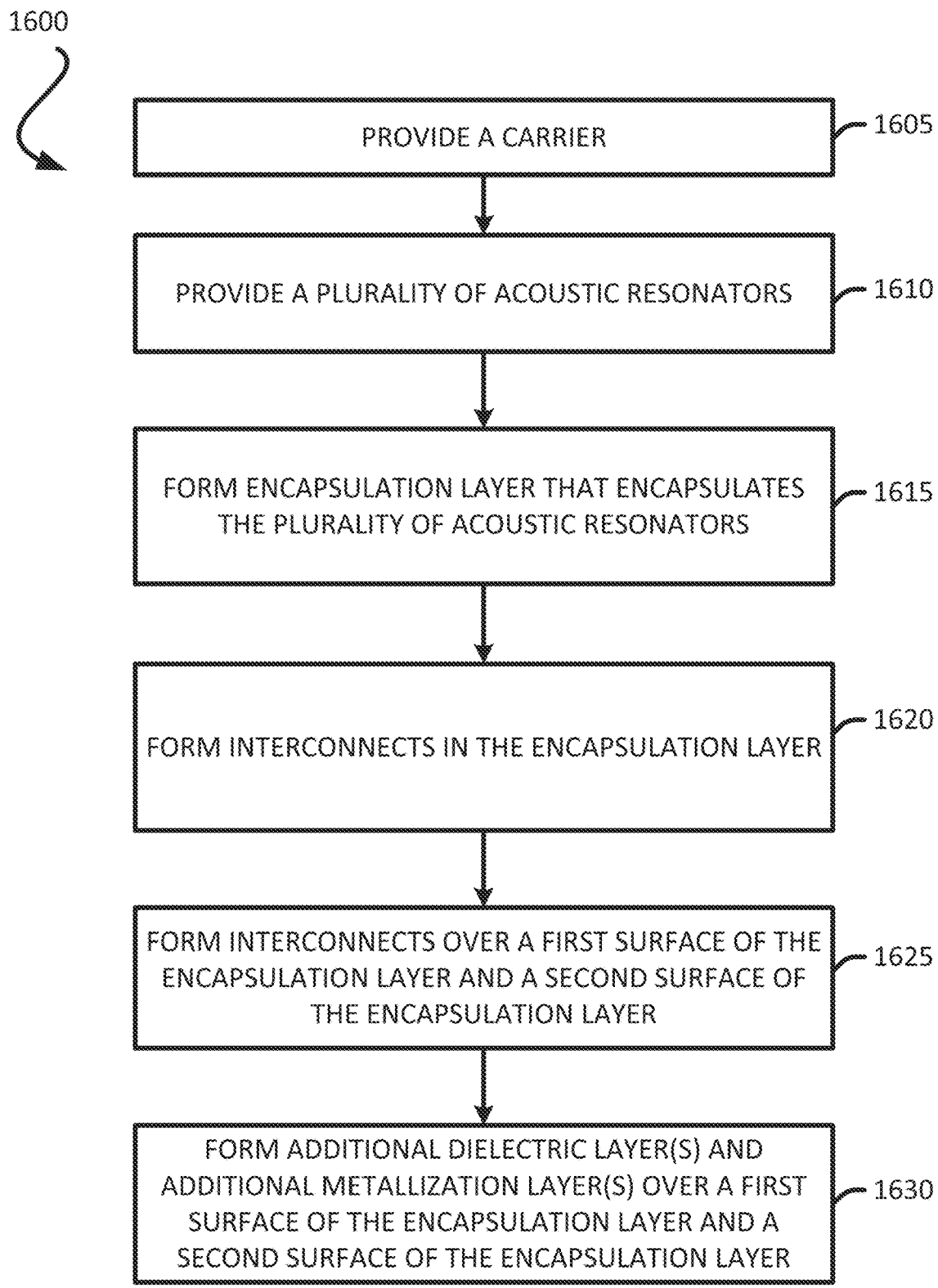
FIG. 16 illustrates an exemplary flow diagram of a method for fabricating a substrate that includes a plurality of acoustic resonators.

Exemplary Flow Diagram of a Method for Fabricating a Substrate that Includes Acoustic Resonators FIG. 16 illustrates an exemplary flow diagram of a method 1600 for providing or fabricating a substrate that includes acoustic resonators. In some implementations, the method 1600 of FIG. 16 may be used to provide or fabricate the substrate 202 of FIG. 2. However, the method 1600 may be used to fabricate any substrate that includes acoustic resonators.

It should be noted that the method of FIG. 16 may combine one or more processes in order to simplify and/or clarify the method for providing or fabricating a substrate. In some implementations, the order of the processes may be changed or modified.

The method provides (at 1605) a carrier (e.g., 1500). The carrier 1500 may include a substrate. Stage 1 of FIG. 15A, illustrates and describes an example of providing carrier.

The method provides (at 1610) at least one acoustic resonator (e.g., 205, 207, 209) over the carrier. The acoustic resonator may be placed using a pick and place process. Stage 2 of FIG. 15A, illustrates and describes an example of providing and placing acoustic resonators over a carrier.

The method forms (at 1615) an encapsulation layer (e.g., 203) over the carrier, and encapsulates the acoustic resonators (e.g., 205, 207, 209). A compression and transfer molding process, a sheet molding process, or a liquid molding process may be used to form the encapsulation layer 203. The encapsulation layer 203 may at least partially encapsulate the at least one acoustic resonators. In some implementations, the encapsulation layer 203 may be formed over the acoustic resonators, and portions of the encapsulation layer 203 may be removed (e.g. grinded) such that a top surface of the encapsulation layer 203 is co-planar with the at least one acoustic resonator (e.g., 205). The encapsulation layer 203 may include a mold, a resin and/or an epoxy. The encapsulation layer 203 may be a means for encapsulation. The encapsulation layer 203 may be photo etchable. Stage 3 of FIG. 15A illustrates and describes an example of forming an encapsulation layer.

Once the encapsulation layer 203 is formed, the method 1600 may decouple the carrier (e.g., 1500) from the encapsulation layer 203 and the acoustic resonators. Decoupling the carrier 1500, may include removing, detaching, grinding and/or dissolving the carrier 1500 using a mechanical process and/or a chemical process. Stage 4 of FIG. 15B illustrates and describes an example of carrier decoupling.

The method forms (at 1620) a plurality of interconnects (e.g., 230, 234, 236) in the encapsulation layer (e.g., 203). The interconnects may be formed after the encapsulation layer is formed and/or after the decoupling of the carrier 1500. The interconnects may include via interconnect that extend through the encapsulation layer. The interconnects may be coupled to the acoustic resonators in the encapsulation layer. Forming the interconnects (e.g., 230) in the encapsulation layer may include forming cavities in the encapsulation layer and filing the cavities with an electrically conductive material. A plating process and/or a pasting process may be used to form the interconnects in the encapsulation layer. Stages 5-7 of FIGS. 15B-15C illustrate and describe an example of forming interconnects in an encapsulation layer.

The method forms (at 1625) interconnects (e.g., 1520, 1530) over a surface the encapsulation layer (e.g., 203). Interconnects may be formed over a first surface of the encapsulation layer and over a second surface of the encapsulation layer. A plating process may be used to form the interconnects over the encapsulation layer. The interconnects (e.g., 1520, 1530) may be coupled to the interconnects (e.g., 230, 234, 236) in the encapsulation layer and to the at least one acoustic resonator (e.g., 205, 207, 209). Stage 8 of FIG. 15C illustrates and describes an example of forming interconnects over a surface of an encapsulation layer.

The method may form (at 1630) dielectric layers (e.g., 1540, 1560) over (i) the first surface of the encapsulation layer and (ii) the second surface of the encapsulation layer. The method may also form (at 1630) additional interconnects (e.g., 1542, 1562) in and over the dielectric layers (e.g., 1540, 1560). Forming the additional interconnects may include forming cavities in the dielectric layers. Stages 9-12 of FIGS. 15D-15E illustrate and describe examples of forming additional dielectric layers and additional interconnects.

Exemplary Electronic Devices

Figure 17:
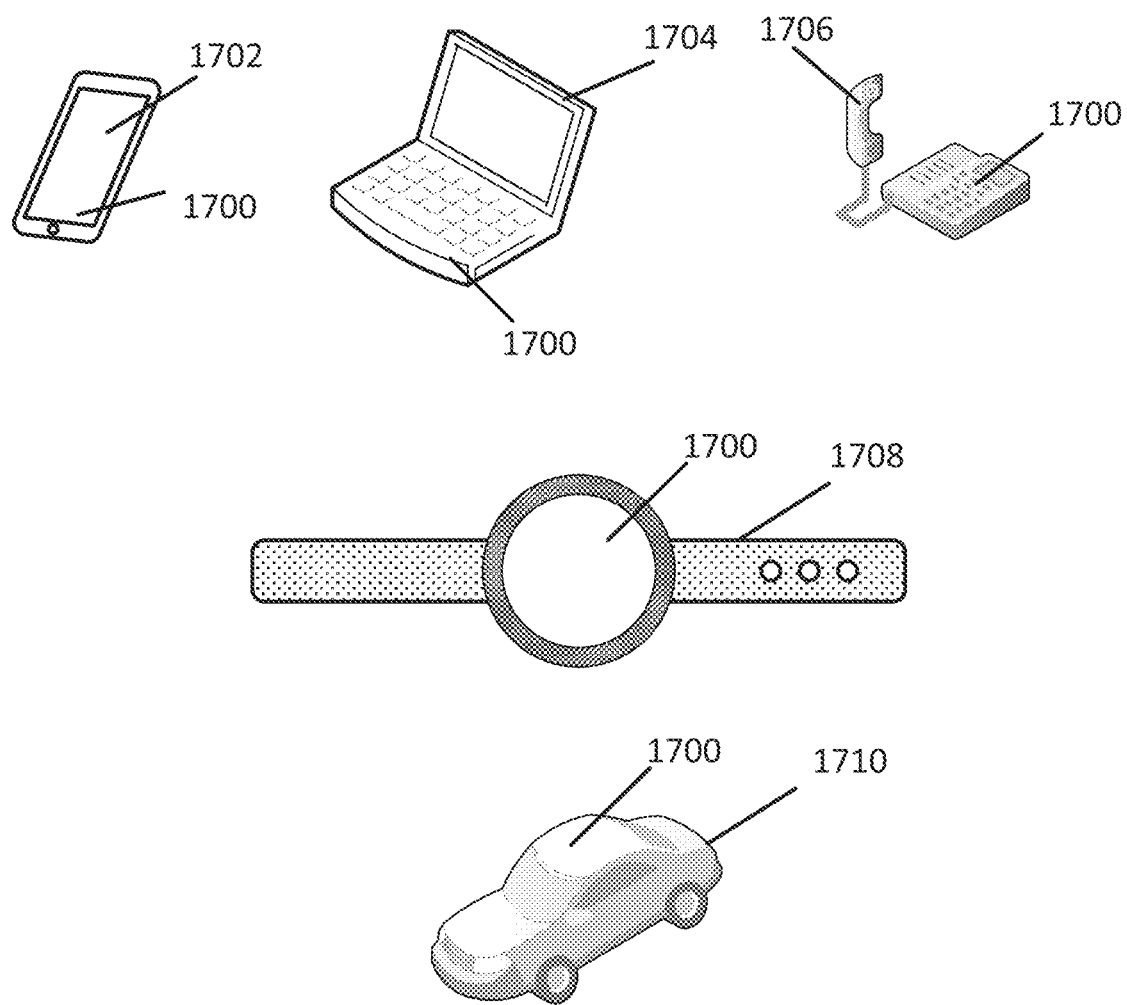
FIG. 17 illustrates various electronic devices that may integrate a die, an integrated device, an integrated passive device (IPD), a device package, a package, an integrated circuit and/or PCB described herein.

FIG. 17 illustrates various electronic devices that may be integrated with any of the aforementioned transistor, device, integrated device, integrated circuit (IC) package, integrated circuit (IC) device, semiconductor device, integrated circuit, die, interposer, package or package-on-package (PoP). For example, a mobile phone device 1702, a laptop computer device 1704, a fixed location terminal device 1706, or a wearable device 1708 may include a device 1700 as described herein. The device 1700 may be, for example, any of the devices and/or integrated circuit (IC) packages described herein. The devices 1702, 1704, 1706 and 1708 illustrated in FIG. 17 are merely exemplary. Other electronic devices may also feature the device 1700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-14, 15A-15F and 16-17 may be rearranged and/or combined into a single component, process, feature or function or embodied in several components, processes, or functions. Additional elements, components, processes, and/or functions may also be added without departing from the disclosure. It should also be noted FIGS. 2-14, 15A-15F and 16-17 and its corresponding description in the present disclosure is not limited to dies and/or ICs. In some implementations, FIGS. 2-14, 15A-15F and 16-17 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. Electromagnetic coupling may mean that a signal from one circuit and/or component affects a signal of another circuit and/or component. Electromagnetic coupling may cause crosstalk. Electromagnetic coupling may be a form of signal coupling. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "top" and "bottom" are arbitrary. A component that is located on top may be located over a component that is located on a bottom. A top component may be considered a bottom component, and vice versa. The term "encapsulating" means that the object may partially encapsulate or completely encapsulate another object. The term "surrounding" means that an object may partially surround or completely surround another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect may include an electrically conductive material that may be configured to provide an electrical path for a signal (e.g., a data signal), ground and/or power. An interconnect may be part of a circuit. An interconnect may include more than one element or component. An interconnect may be defined by one or more interconnects. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A substrate comprising:
    an encapsulation layer having a fixed thickness;
    a first acoustic resonator located in the encapsulation layer, wherein the first acoustic resonator comprises:
        a first substrate; and
        a first piezoelectric layer coupled to the first substrate, wherein the first substrate and the first piezoelectric layer comprise a combined first thickness;
    a second acoustic resonator located in the encapsulation layer, wherein the second acoustic resonator comprises:
        a second substrate; and
        a second piezoelectric layer coupled to the second substrate, wherein the second substrate and the second piezoelectric layer comprise a combined second thickness that is different than the first thickness,
        wherein the second piezoelectric layer is a separate piezoelectric layer from the first piezoelectric layer,
        wherein the second substrate is a separate substrate from the first substrate,
        wherein the second acoustic resonator is located laterally to the first acoustic resonator in the encapsulation layer, and
        wherein the second acoustic resonator does not vertically overlap with the first acoustic resonator;
    at least one first dielectric layer coupled to a first surface of the encapsulation layer;
    a plurality of first interconnects coupled to the first surface of the encapsulation layer, wherein the plurality of first interconnects is located at least partially in the at least one first dielectric layer;
    at least one second dielectric layer coupled to a second surface of the encapsulation layer, wherein each of the at least one first electric layer and the at least second dielectric layer includes a material that is different from the encapsulation layer;
    a plurality of second interconnects coupled to the second surface of the encapsulation layer, wherein the plurality of second interconnects is located at least in the at least one second dielectric layer; and
    a matching inductor or matching capacitor coupled to at least one of the first acoustic resonator or the second acoustic resonator,
    wherein the first acoustic resonator is one of an acoustic wave (SAW) device, a bulk acoustic wave (BAW) device, a thin-film bulk acoustic wave resonator (FBAR) or a contour mode resonator (CMR), and
    wherein the second acoustic resonator is a different type of acoustic resonator from the first acoustic resonator.

2. The substrate of claim 1, further comprising a plurality of via interconnects located in the encapsulation layer.

3. The substrate of claim 2, wherein the plurality of via interconnects includes at least one first via interconnect coupled to the first acoustic resonator.

4. The substrate of claim 3, wherein the at least one first via interconnect is coupled to the plurality of first interconnects.

5. The substrate of claim 3, wherein the at least one first via interconnect is coupled to the plurality of second interconnects.

6. The substrate of claim 1,
    wherein the at least one first dielectric layer and the plurality of first interconnects form a first metallization portion coupled to the first surface of the encapsulation layer, and
    wherein the at least one second dielectric layer and the plurality of second interconnects form a second metallization portion coupled to the second surface of the encapsulation layer.

7. The substrate of claim 6,
    wherein the first metallization portion includes a first redistribution portion, and
    wherein the second metallization portion includes a second redistribution portion.

8. The substrate of claim 1, further comprising:
a third acoustic resonator located in the encapsulation layer, wherein the third acoustic resonator comprises:
a third substrate; and
a third piezoelectric layer coupled to the third substrate, wherein the third substrate and the third piezoelectric layer comprise a combined third thickness that is different than the first thickness and the second thickness; and
a fourth acoustic resonator located in the encapsulation layer, wherein the fourth acoustic resonator comprises:
a fourth substrate; and
a fourth piezoelectric layer coupled to the fourth substrate, wherein the fourth substrate and the fourth piezoelectric layer comprise a combined fourth thickness that is different than the first thickness, the second thickness, and the third thickness.

9. The substrate of claim 8, wherein the first acoustic resonator, the second acoustic resonator, the third acoustic resonator and the fourth acoustic resonator are configured as an acoustic filter.

10. The substrate of claim 1, wherein the first acoustic resonator, the second acoustic resonator, the inductor and the capacitor are configured as a duplexer.

11. An apparatus comprising:
an integrated device; and
a substrate coupled to the integrated device, the substrate comprising:
means for encapsulation;
means for first acoustic resonance located in the means for encapsulation, wherein the means for first acoustic resonance comprises: a first substrate and a first piezoelectric layer coupled to the first substrate, wherein the first substrate and the first piezoelectric layer comprise a combined first thickness;
means for second acoustic resonance located in the means for encapsulation, wherein the means for second acoustic resonance comprises: a second substrate; and a second piezoelectric layer coupled to the second substrate, wherein the second substrate and the second piezoelectric layer comprise a combined second thickness that is different than the first thickness, wherein the second piezoelectric layer is a separate piezoelectric layer from the first piezoelectric layer, wherein the second substrate is a separate substrate from the first substrate;
wherein the means for second acoustic resonance is located laterally to the means for first acoustic resonance in the means for encapsulation, and
wherein the means for second acoustic resonance does not vertically overlap with the means for first acoustic resonance;
at least one first dielectric layer coupled to a first surface of the means for encapsulation;
a plurality of first interconnects coupled to the first surface of the means for encapsulation, wherein the plurality of first interconnects is located at least partially in the at least one first dielectric layer;
at least one second dielectric layer coupled to a second surface of the means for encapsulation, wherein each of the at least one first electric layer and the at least second dielectric layer includes a material that is different from the means for encapsulation;
a plurality of second interconnects coupled to the second surface of the means for encapsulation, wherein the plurality of second interconnects is located at least in the at least one second dielectric layer;
wherein the means for encapsulation is coupled to the at least one first dielectric layer,
wherein the means for first acoustic resonance is one of an acoustic wave (SAW) device, a bulk acoustic wave (BAW) device, a thin-film bulk acoustic wave resonator (FBAR) or a contour mode resonator (CMR), wherein the means for second acoustic resonance is a different type of means for acoustic resonance than the means for first acoustic resonance; and
a matching inductor or matching capacitor coupled to at least one of the means for first acoustic resonance or the means for second acoustic resonance.

12. The apparatus of claim 11, further comprising a plurality of via interconnects located in the means for encapsulation.

13. The apparatus of claim 12, wherein the plurality of via interconnects includes at least one first via interconnect coupled to the means for first acoustic resonance.

14. The apparatus of claim 11,
wherein the at least one first dielectric layer and the plurality of first interconnects form a first metallization portion coupled to the first surface of the means for encapsulation, and
wherein the at least one second dielectric layer and the plurality of second interconnects form a second metallization portion coupled to the second surface of the means for encapsulation.

15. The apparatus of claim 11, further comprising a means for third acoustic resonance and a means for fourth acoustic resonance, wherein the means for first acoustic resonance, the means for second acoustic resonance, the means for third acoustic resonance and the means for fourth acoustic resonance are configured as an acoustic filter.

16. The apparatus of claim 11, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

17. A method for fabricating a substrate, comprising:
providing a first acoustic resonator comprising a first substrate and a first piezoelectric layer coupled to the first substrate, wherein the first substrate and the first piezoelectric layer comprise a combined a first thickness;
providing a second acoustic resonator comprising a second substrate and a second piezoelectric layer coupled to the second substrate, wherein the second substrate and the second piezoelectric layer comprise a combined second thickness that is different than the first thickness, wherein the second piezoelectric layer is a separate piezoelectric layer from the first piezoelectric layer, wherein the second substrate is a separate substrate from the first substrate;
forming an encapsulation layer over the first acoustic resonator and the second acoustic resonator,
wherein the second acoustic resonator is located laterally to the first acoustic resonator in the encapsulation layer, and
wherein the second acoustic resonator does not vertically overlap with the first acoustic resonator in the encapsulation layer,
forming a plurality of first interconnects over a first surface of the encapsulation layer;

forming at least one first dielectric layer over the first surface of the encapsulation layer;

forming a plurality of second interconnects over a second surface of the encapsulation layer;

forming at least one second dielectric layer over the second surface of the encapsulation layer, wherein each of the at least one first electric layer and the at least second dielectric layer includes a material that is different from the encapsulation layer; and providing a matching inductor or matching capacitor coupled to at least one of the first acoustic resonator, or the second acoustic resonator, wherein the at least one first dielectric layer and the plurality of first interconnects form a first metallization portion coupled to the first surface of the encapsulation layer, wherein the at least one second dielectric layer and the plurality of second interconnects form a second metallization portion coupled to the second surface of the encapsulation layer, wherein the encapsulation layer is coupled to the at least one first dielectric layer, wherein the first acoustic resonator is one of an acoustic wave (SAW) device, a bulk acoustic wave (BAW) device, a thin-film bulk acoustic wave resonator (FBAR) or a contour mode resonator (CMR), and wherein the second acoustic resonator is a different type of acoustic resonator from the first acoustic resonator.

18. The method of claim 17, further comprising forming a plurality of via interconnects in the encapsulation layer.

19. The method of claim 17, further comprising a third acoustic resonator and a fourth acoustic resonator, wherein the first acoustic resonator, the second acoustic resonator, the third acoustic resonator and the fourth acoustic resonator are configured as an acoustic filter.

* * * * *